United States Patent
Kim et al.

(10) Patent No.: US 11,293,602 B2
(45) Date of Patent: Apr. 5, 2022

(54) HIGH COLOR RENDERING D50/D65 STANDARD LED ILLUMINANT MODULE AND LIGHTING APPARATUS

(71) Applicant: GLBTECH CO., LTD., Gyeonggi-do (KR)

(72) Inventors: Han Do Kim, Gyeonggi-do (KR); Byung Soon Kim, Gyeonggi-do (KR); Guen Ryeol Park, Gyeonggi-do (KR); Eun Mi Park, Jeollabuk-do (KR); Yong Sun Choi, Gyeonggi-do (KR)

(73) Assignee: GLBTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 17/198,590

(22) Filed: Mar. 11, 2021

(65) Prior Publication Data

US 2021/0270427 A1    Sep. 2, 2021

Related U.S. Application Data

(63) Continuation of application No. 16/643,434, filed on Feb. 28, 2020, now Pat. No. 10,982,824.

(51) Int. Cl.
*F21K 9/64*    (2016.01)
*F21S 2/00*    (2016.01)

(52) U.S. Cl.
CPC ............... *F21K 9/64* (2016.08); *F21S 2/005* (2013.01)

(58) Field of Classification Search
CPC .................................. F21K 9/64; F21S 2/005
(Continued)

(56) References Cited

U.S. PATENT DOCUMENTS 7,745,985 B2 * 6/2010 Tanimoto ............... H04N 9/315
313/501
2002/0048169 A1 * 4/2002 Dowling ............... H05B 45/28
362/234
(Continued)

FOREIGN PATENT DOCUMENTS

EP    3001467 A1    3/2016

OTHER PUBLICATIONS

European Search Report (in English), dated May 10, 2021, for the European National Stage of International Patent Cooperation Treaty Application No. PCT/KR2018/010336.

*Primary Examiner* — Bryon T Gyllstrom
(74) *Attorney, Agent, or Firm* — Barcelo, Harrison & Walker, LLP

(57) ABSTRACT

The present invention relates to an LED illuminant module and lighting apparatus and, more specifically, to a high color rendering D50/D65 standard LED illuminant module and lighting apparatus, which has both high color rendering properties and excellent metamerism index characteristics by using a high color rendering LED and an ultraviolet LED. An illuminant module according to an embodiment of the present invention comprises: at least one ultraviolet light-emitting diode (LED) device having a peak emission wavelength of 300 nm-400 nm; and at least one first white light-emitting diode (LED) device having an average color rendering index of 90% or higher, wherein the first white light-emitting diode (LED) device is a light-emitting diode (LED) device which comprises a first LED chip having an excitation wavelength of 440 nm-460 nm, and a first phosphor layer excited at the excitation wavelength of the first LED chip to emit light, and the first phosphor layer comprises: a first phosphor having a peak emission wavelength of 440 nm-499 nm; a second phosphor having a peak (Continued)

emission wavelength of 500 nm-580 nm; and a third phosphor having a peak emission wavelength of 600 nm-699 nm.

18 Claims, 27 Drawing Sheets

(58) Field of Classification Search
USPC .......................................................... 362/84
See application file for complete search history.

(56) References Cited

U.S. PATENT DOCUMENTS

| | | | |
|---|---|---|---|
| 2002/0070688 A1* | 6/2002 | Dowling | A61N 5/0618 |
| | | | 315/312 |
| 2002/0101197 A1* | 8/2002 | Lys | H05B 45/20 |
| | | | 315/291 |
| 2003/0133292 A1* | 7/2003 | Mueller | F21K 9/00 |
| | | | 362/231 |
| 2004/0160199 A1* | 8/2004 | Morgan | A01M 1/04 |
| | | | 315/312 |
| 2005/0040773 A1* | 2/2005 | Lebens | H04B 10/502 |
| | | | 315/291 |
| 2006/0072314 A1* | 4/2006 | Rains | F21S 41/37 |
| | | | 362/231 |
| 2008/0258602 A1* | 10/2008 | Masuda | H01L 33/507 |
| | | | 313/487 |
| 2010/0219428 A1* | 9/2010 | Jung | F21V 23/009 |
| | | | 257/89 |
| 2014/0224970 A1* | 8/2014 | Ohkubo | G01J 1/42 |
| | | | 250/216 |
| 2014/0225137 A1 | 8/2014 | Krames et al. | |
| 2016/0218255 A1* | 7/2016 | Kim | H01L 33/504 |

* cited by examiner

FIG. 2

| PERFORMANCE ITEM | REFERENCE VALUE |
|---|---|
| VISIBLE RANGE METAMERISM INDEX (Mivis) | 1.0 OR LOWER |
| UV-RANGE METAMERISM INDEX (Mluv) | 1.5 OR LOWER |
| AVERAGE COLOR RENDERING INDEX (Ra) | 95 OR HIGHER |
| SPECIAL COLOR RENDERING INDEXES (R9 TO R15) | 85 OR HIGHER |

[TABLE] PERFORMANCE SPECIFICATIONS OF D65 AND D50 STANDARD ILLUMINANTS

FIG. 6A

| IF | CCT | UvCont ent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 10 | 6395 | 0 | 0.8 | 6 | 98.3 | 98.6 | 98.9 | 98 | 96 | 97.7 | 98.4 | 99.4 | 99.3 | 98.2 | 95.2 | 92.1 | 92.2 | 98.1 | 98.2 |
| 30 | 6398 | 0 | 0.8 | 5.8 | 98.3 | 98.6 | 98.9 | 98.1 | 96 | 97.7 | 98.4 | 99.4 | 99.3 | 98.1 | 95.1 | 92.1 | 92.2 | 98.1 | 98.2 |
| 60 | 6400 | 0 | 0.8 | 5.4 | 98.3 | 98.6 | 98.9 | 98.1 | 96 | 97.7 | 98.4 | 99.4 | 99.3 | 98.1 | 95.2 | 92.1 | 92.2 | 98.2 | 98.2 |
| 90 | 6402 | 0 | 0.8 | 5.1 | 98.3 | 98.6 | 98.9 | 98.1 | 96 | 97.7 | 98.4 | 99.4 | 99.3 | 98.1 | 95.2 | 92.1 | 92.2 | 98.2 | 98.2 |
| 120 | 6402 | 0 | 0.8 | 4.8 | 98.3 | 98.6 | 99 | 98.1 | 96 | 97.7 | 98.4 | 99.4 | 99.4 | 98.2 | 95.2 | 92.1 | 92.2 | 98.2 | 98.3 |
| 150 | 6407 | 0 | 0.8 | 4.5 | 98.3 | 98.6 | 99 | 98.1 | 96 | 97.7 | 98.4 | 99.4 | 99.4 | 98.2 | 95.2 | 92.1 | 92.2 | 98.2 | 98.2 |
| 180 | 6405 | 0 | 0.7 | 4.2 | 98.3 | 98.5 | 99 | 98.1 | 96 | 97.7 | 98.4 | 99.4 | 99.3 | 98.1 | 95.2 | 92.1 | 92.3 | 98.2 | 98.3 |
| 210 | 6411 | 0.7 | 0.7 | 3.9 | 98.3 | 98.6 | 99 | 98.1 | 95.9 | 97.7 | 98.4 | 99.4 | 99.4 | 98.1 | 95.2 | 92.1 | 92.2 | 98.2 | 98.3 |
| 240 | 6410 | 10 | 0.7 | 3.7 | 98.3 | 98.5 | 99 | 98.1 | 95.9 | 97.7 | 98.4 | 99.4 | 99.3 | 98 | 95.2 | 92.1 | 92.2 | 98.2 | 98.3 |
| 270 | 6411 | 18.7 | 0.7 | 3.4 | 98.3 | 98.5 | 99 | 98.1 | 95.9 | 97.7 | 98.4 | 99.4 | 99.3 | 98 | 95.2 | 92.1 | 92.2 | 98.2 | 98.3 |
| 300 | 6412 | 28 | 0.7 | 3.1 | 98.3 | 98.5 | 99 | 98.1 | 96 | 97.7 | 98.4 | 99.4 | 99.4 | 98.1 | 95.2 | 92.1 | 92.2 | 98.2 | 98.3 |
| 330 | 6411 | 36.2 | 0.7 | 2.9 | 98.3 | 98.5 | 99 | 98.2 | 96 | 97.7 | 98.4 | 99.5 | 99.4 | 98.1 | 95.2 | 92.2 | 92.2 | 98.2 | 98.3 |
| 360 | 6413 | 44.3 | 0.7 | 2.7 | 98.3 | 98.5 | 99 | 98.1 | 96 | 97.7 | 98.4 | 99.5 | 99.4 | 98 | 95.2 | 92.2 | 92.2 | 98.2 | 98.3 |
| 390 | 6420 | 50.1 | 0.7 | 2.5 | 98.3 | 98.5 | 99 | 98.2 | 95.9 | 97.7 | 98.4 | 99.5 | 99.4 | 97.8 | 95.2 | 92.1 | 92.2 | 98.2 | 98.3 |
| 420 | 6423 | 59 | 0.7 | 2.2 | 98.3 | 98.4 | 99 | 98.2 | 96 | 97.7 | 98.3 | 99.5 | 99.3 | 97.9 | 95.1 | 92.2 | 92.1 | 98.2 | 98.3 |
| 450 | 6425 | 62.4 | 0.5 | 1.5 | 98.3 | 98.4 | 98.9 | 98.2 | 95.9 | 97.7 | 98.3 | 99.5 | 99.2 | 97.7 | 95.1 | 92.2 | 92.2 | 98.2 | 98.3 |
| 480 | 6429 | 71.9 | 0.5 | 1.5 | 98.3 | 98.4 | 99 | 98.2 | 95.9 | 97.7 | 98.3 | 99.5 | 99.3 | 97.8 | 95.2 | 92.2 | 92.1 | 98.2 | 98.3 |
| 510 | 6431 | 69.3 | 0.5 | 1.5 | 98.2 | 98.3 | 98.9 | 98.2 | 95.9 | 97.6 | 98.2 | 99.5 | 99.2 | 97.6 | 95 | 92.2 | 92.1 | 98.2 | 98.3 |
| 540 | 6429 | 82.8 | 0.5 | 1.5 | 98.3 | 98.3 | 99 | 98.2 | 95.9 | 97.7 | 98.3 | 99.5 | 99.2 | 97.7 | 95.1 | 92.2 | 92.1 | 98.3 | 98.3 |
| 570 | 6431 | 84.3 | 0.5 | 1.5 | 98.2 | 98.3 | 98.9 | 98.2 | 95.9 | 97.6 | 98.2 | 99.5 | 99.1 | 97.5 | 95.1 | 92.2 | 92.1 | 98.2 | 98.4 |
| 600 | 6434 | 70.2 | 0.5 | 1.5 | 98.2 | 98.2 | 98.9 | 98.2 | 95.9 | 97.6 | 98.1 | 99.6 | 99.1 | 97.4 | 95 | 92.2 | 92.1 | 98.2 | 98.4 |
| 650 | 6440 | 80.3 | 0.5 | 1.5 | 98.2 | 98.1 | 98.9 | 98.2 | 95.9 | 97.6 | 98.1 | 99.6 | 99.2 | 97.2 | 94.9 | 92.2 | 92 | 98.1 | 98.4 |
| 700 | 6442 | 69.3 | 0.5 | 1.5 | 98.2 | 98.1 | 98.9 | 98.2 | 95.9 | 97.6 | 98 | 99.6 | 99 | 97.1 | 94.9 | 92.2 | 92 | 98.2 | 98.4 |
| 750 | 6446 | 53.3 | 0.7 | 2.3 | 98.1 | 98 | 98.8 | 98.2 | 95.9 | 97.6 | 98 | 99.6 | 99 | 97.1 | 94.9 | 92.2 | 92 | 98.1 | 98.4 |
| 800 | 6447 | 43.7 | 0.7 | 2.5 | 98.1 | 98 | 98.8 | 98.2 | 96 | 97.6 | 97.9 | 99.7 | 98.9 | 97 | 94.8 | 92.3 | 92 | 98 | 98.4 |
| 900 | 6453 | 58.3 | 0.7 | 2.1 | 98.1 | 98 | 98.8 | 98.3 | 95.9 | 97.5 | 98 | 99.7 | 98.9 | 97 | 94.9 | 92.3 | 92 | 98.1 | 98.4 |
| ## | 6462 | 14 | 0.7 | 3.3 | 98 | 97.8 | 98.7 | 98.3 | 95.9 | 97.4 | 97.8 | 99.7 | 98.8 | 96.4 | 94.6 | 92.2 | 92 | 97.9 | 98.4 |

FIG. 7A

| IF | UVContent | Mivis | Miuv | CCT | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 10 | 0 | 0.7 | 5.9 | 6368 | 98.4 | 98.3 | 99 | 98 | 96 | 97.8 | 98.9 | 99 | 99.4 | 98.4 | 95.9 | 92.3 | 93.1 | 98.4 | 98.2 |
| 20 | 0 | 0.7 | 5.5 | 6385 | 98.4 | 98.9 | 99 | 98.1 | 96.1 | 97.9 | 98.6 | 99.4 | 99.6 | 98.3 | 95.5 | 92.3 | 92.6 | 98.3 | 98.2 |
| 30 | 0 | 0.7 | 5.2 | 6388 | 98.4 | 98.8 | 99 | 98.1 | 96.1 | 97.8 | 98.6 | 99.4 | 99.6 | 99 | 95.4 | 92.4 | 92.5 | 98.3 | 98.3 |
| 50 | 0 | 0.7 | 4.6 | 6397 | 98.4 | 98.8 | 99.1 | 98.1 | 95.9 | 97.7 | 98.6 | 99.3 | 99.5 | 98.9 | 95.5 | 92.2 | 92.9 | 98.4 | 98.3 |
| 60 | 0 | 0.7 | 4.2 | 6402 | 98.4 | 98.7 | 99.1 | 98.2 | 95.9 | 97.7 | 98.6 | 99.3 | 99.5 | 98.7 | 95.5 | 92.2 | 92.9 | 98.5 | 98.3 |
| 90 | 15.8 | 0.7 | 3.3 | 6413 | 98.3 | 98.7 | 99.2 | 98.2 | 95.7 | 97.6 | 98.5 | 99.2 | 99.4 | 98.5 | 95.6 | 92.1 | 93.2 | 98.6 | 98.4 |
| 100 | 26.4 | 0.7 | 3 | 6420 | 98.3 | 98.7 | 99.2 | 98.2 | 95.6 | 97.6 | 98.5 | 99.2 | 99.3 | 98.5 | 95.6 | 92.1 | 93.4 | 98.6 | 98.4 |
| 120 | 45.1 | 0.7 | 2.4 | 6425 | 98.2 | 98.6 | 99.2 | 98.3 | 95.4 | 97.5 | 98.5 | 99.1 | 99.2 | 98.1 | 95.6 | 91.9 | 93.6 | 98.6 | 98.5 |
| 150 | 74.8 | 0.5 | 1.5 | 6440 | 98.1 | 98.5 | 99.3 | 98.4 | 95.3 | 97.4 | 98.4 | 99 | 99 | 97.8 | 95.7 | 91.9 | 93.9 | 98.7 | 98.5 |
| 150 | 79.8 | 0.5 | 1.5 | 6482 | 97.9 | 98.1 | 99.2 | 98.4 | 94.8 | 97.1 | 98.2 | 98.9 | 98.5 | 96.3 | 95.4 | 91.4 | 94 | 98.4 | 98.6 |
| 170 | 92 | 0.5 | 1.5 | 6484 | 97.9 | 98.1 | 99.2 | 98.4 | 94.8 | 97.1 | 98.2 | 98.8 | 98.5 | 96.5 | 95.5 | 91.4 | 94 | 98.5 | 98.6 |
| 180 | 110.6 | 0.5 | 1.5 | 6453 | 98.1 | 98.4 | 99.4 | 98.4 | 95.1 | 97.3 | 98.3 | 98.9 | 98.8 | 97.5 | 95.8 | 91.8 | 94.3 | 98.7 | 98.6 |
| 210 | 125.9 | 0.6 | 2.3 | 6470 | 98 | 98.3 | 99.4 | 98.5 | 94.8 | 97.2 | 98.2 | 98.8 | 98.6 | 97.2 | 95.8 | 91.6 | 94.6 | 98.7 | 98.7 |
| 240 | 152.1 | 0.6 | 2.9 | 6482 | 97.9 | 98.2 | 99.4 | 98.5 | 94.6 | 97 | 98.1 | 98.7 | 98.4 | 96.9 | 95.9 | 91.5 | 95 | 98.7 | 98.7 |
| 270 | 171.4 | 0.6 | 3.4 | 6503 | 97.8 | 98.2 | 99.5 | 98.6 | 94.4 | 97 | 98 | 98.6 | 98.3 | 96.6 | 96 | 91.4 | 95.3 | 98.7 | 98.8 |
| 300 | 194.2 | 0.5 | 4 | 6515 | 97.7 | 98.1 | 99.5 | 98.6 | 94.2 | 96.8 | 98 | 98.4 | 98 | 96.2 | 96 | 91.3 | 95.7 | 98.6 | 98.8 |
| 330 | 215.8 | 0.5 | 4.6 | 6531 | 97.6 | 98 | 99.5 | 98.6 | 94 | 96.7 | 97.9 | 98.3 | 97.8 | 95.9 | 96 | 91.1 | 96 | 98.4 | 98.9 |
| 360 | 232.7 | 0.5 | 5 | 6550 | 97.5 | 97.9 | 99.5 | 98.6 | 93.8 | 96.6 | 97.7 | 98.2 | 97.7 | 95.6 | 96.1 | 91 | 96.3 | 98.3 | 98.9 |
| 390 | 250.3 | 0.5 | 5.5 | 6566 | 97.4 | 97.8 | 99.5 | 98.6 | 93.5 | 96.5 | 97.6 | 98.1 | 97.5 | 95.2 | 96.1 | 90.9 | 96.7 | 98.2 | 98.9 |
| 420 | 256.1 | 0.4 | 5.7 | 6587 | 97.3 | 97.7 | 99.5 | 98.6 | 93.3 | 96.3 | 97.5 | 98 | 97.3 | 94.8 | 96.1 | 90.7 | 97.1 | 98.1 | 99 |
| 450 | 283.7 | 0.4 | 6.3 | 6503 | 97.1 | 97.5 | 99.4 | 98.6 | 93.1 | 96.2 | 97.4 | 97.9 | 97.1 | 94.3 | 96.2 | 90.6 | 97.4 | 97.9 | 99 |
| 480 | 298.3 | 0.4 | 6.7 | 6617 | 97.1 | 97.5 | 99.4 | 98.6 | 92.9 | 96.1 | 97.3 | 97.8 | 96.9 | 94.2 | 96.3 | 90.5 | 97.6 | 97.8 | 99 |
| 510 | 339.6 | 0.4 | 7.5 | 6622 | 96.9 | 97.4 | 99.4 | 98.5 | 92.7 | 96 | 97.2 | 97.7 | 96.7 | 93.8 | 96.3 | 90.3 | 97.9 | 98.3 | 99 |
| 540 | 297.9 | 0.4 | 6.9 | 6651 | 96.8 | 97.2 | 99.3 | 98.4 | 92.4 | 95.9 | 97 | 97.7 | 96.6 | 93.2 | 96.3 | 90.1 | 98.4 | 97.5 | 99 |
| 570 | 292.8 | 0.4 | 6.9 | 6664 | 96.7 | 97.1 | 99.2 | 98.4 | 92.3 | 95.8 | 97 | 97.4 | 96.5 | 93.1 | 96.3 | 90 | 98.7 | 97.4 | 99 |
| 600 | 298.4 | 0.4 | 7.1 | 6683 | 96.6 | 97.1 | 99.2 | 98.3 | 92.1 | 95.7 | 97 | 97.3 | 96.4 | 92.7 | 96.3 | 89.9 | 99 | 97.3 | 99 |

FIG. 8A

| IF | CCT | UVCont ent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 10 | 6405 | 0 | 0.7 | 5.9 | 98 | 98.3 | 98.9 | 98.1 | 95.3 | 97.3 | 98.3 | 99 | 98.8 | 97 | 95 | 91.5 | 93.7 | 98 | 98.3 |
| 15 | 6400 | 0 | 0.6 | 5.7 | 98 | 98.4 | 98.2 | 98.4 | 95 | 97.2 | 98.6 | 98.6 | 98.5 | 97.2 | 95.7 | 91.4 | 94.6 | 98.3 | 98.6 |
| 20 | 6451 | 0 | 0.5 | 5.6 | 97.8 | 98.2 | 98.3 | 98.5 | 94.5 | 97 | 98.6 | 98.2 | 98.1 | 96.3 | 95.9 | 91 | 95.5 | 98.3 | 98.7 |
| 25 | 6472 | 0 | 0.5 | 5.6 | 97.7 | 98.1 | 99.4 | 98.6 | 94.2 | 96.8 | 98.6 | 98 | 97.8 | 95.9 | 96 | 90.8 | 96 | 98.3 | 98.8 |
| 30 | 6541 | 0 | 0.5 | 5.5 | 97.3 | 97.6 | 99.3 | 98.6 | 93.6 | 96.4 | 98.3 | 97.8 | 97.3 | 94.2 | 95.6 | 90.2 | 96.8 | 98 | 98.8 |
| 60 | 6755 | 0 | 0.6 | 5 | 96.3 | 96.7 | 99.3 | 97.9 | 91.3 | 95.3 | 98.4 | 96.2 | 95.4 | 90.7 | 96.4 | 88.5 | 98.8 | 97.6 | 98.8 |
| 90 | 6964 | 0 | 0.9 | 4.5 | 95.2 | 95.8 | 98.9 | 96.7 | 89.1 | 94.2 | 98.4 | 94.7 | 93.6 | 87.3 | 96.8 | 86.9 | 95.3 | 96.9 | 98.2 |
| 120 | 7173 | 0 | 1.1 | 4.1 | 94 | 94.9 | 98.4 | 95.4 | 87 | 93.2 | 98.4 | 93.3 | 91.9 | 83.7 | 96.8 | 95.3 | 92 | 96.1 | 97.4 |
| 150 | 7425 | 0 | 1.3 | 3.8 | 92.8 | 93.9 | 97.8 | 93.9 | 84.8 | 92.1 | 98.3 | 91.8 | 90 | 79.8 | 96.3 | 83.6 | 88.7 | 95.1 | 96.5 |
| 180 | 7688 | 0 | 1.6 | 3.5 | 91.7 | 93 | 97.2 | 92.4 | 82.8 | 91.1 | 98.2 | 90.5 | 88.3 | 76.1 | 95.6 | 82 | 85.8 | 94.2 | 95.5 |
| 210 | 7969 | 0 | 1.9 | 3.5 | 90.6 | 92.1 | 96.6 | 90.9 | 80.9 | 90.2 | 98 | 89.3 | 86.6 | 72.7 | 94.8 | 80.4 | 83.2 | 93.3 | 94.6 |
| 240 | 8255 | 0 | 2.2 | 3.7 | 89.6 | 91.3 | 96 | 89.5 | 79.1 | 89.4 | 97.9 | 88.1 | 85.1 | 69.4 | 93.8 | 79 | 80.9 | 92.5 | 93.7 |
| 270 | 8639 | 0 | 2.5 | 3.8 | 88.3 | 90.3 | 95.3 | 87.8 | 76.9 | 88.5 | 97.6 | 86.7 | 83.2 | 65 | 92.6 | 77.2 | 78.3 | 91.5 | 92.6 |
| 300 | 8940 | 8.4 | 2.7 | 4 | 87.4 | 89.6 | 94.8 | 86.5 | 75.3 | 87.8 | 97.5 | 85.7 | 82.1 | 62.4 | 91.5 | 76.1 | 76.3 | 90.7 | 91.8 |
| 330 | 9359 | 11.3 | 3 | 4.1 | 86.4 | 88.9 | 94.1 | 84.9 | 73.5 | 87.1 | 97.2 | 84.5 | 80.6 | 59.2 | 90.2 | 74.7 | 74.3 | 89.9 | 90.8 |
| 360 | 9826 | 15 | 3.2 | 4.2 | 85.2 | 88 | 93.5 | 83.2 | 71.6 | 86.3 | 96.8 | 83.3 | 78.9 | 55.3 | 88.8 | 73.1 | 72.4 | 88.9 | 89.7 |
| 390 | 10226 | 21.3 | 3.4 | 4.4 | 84.4 | 87.3 | 92.9 | 82 | 70.2 | 85.7 | 96.6 | 82.4 | 77.8 | 52.7 | 87.7 | 71.9 | 70.8 | 88.1 | 88.9 |
| 420 | 10759 | 24.2 | 3.6 | 4.5 | 83.4 | 86.7 | 92.3 | 80.5 | 68.5 | 85.1 | 96.2 | 81.4 | 76.5 | 49.8 | 86.4 | 70.6 | 69.1 | 87.3 | 88 |
| 450 | 11251 | 31.2 | 3.8 | 4.6 | 82.6 | 86.1 | 91.7 | 79.1 | 67.1 | 84.6 | 95.9 | 80.5 | 75.4 | 47.1 | 85.2 | 69.5 | 67.7 | 86.6 | 87.2 |
| 480 | 12369 | 24.4 | 4 | 4.7 | 81.1 | 84.9 | 90.7 | 76.8 | 64.7 | 83.8 | 95 | 79 | 73.4 | 42.2 | 83 | 67.4 | 66.1 | 85.4 | 85.7 |
| 510 | 13178 | 25.8 | 4.1 | 4.7 | 80 | 84.1 | 90.1 | 75.2 | 63.1 | 83.1 | 94.5 | 78.1 | 72 | 38.6 | 83 | 66 | 64.9 | 84.4 | 84.7 |
| 540 | 13796 | 31.7 | 4.3 | 4.8 | 79.4 | 83.7 | 89.5 | 74.1 | 61.9 | 82.8 | 94.2 | 77.3 | 71.4 | 37.1 | 80.3 | 65.2 | 63.6 | 83.8 | 84.1 |
| 570 | 15237 | 28.8 | 4.4 | 4.9 | 78.2 | 82.9 | 88.7 | 72.1 | 60.1 | 82.2 | 93.4 | 76.2 | 69.8 | 33.1 | 78.3 | 63.6 | 62.6 | 82.8 | 82.8 |
| 600 | 16232 | 35 | 4.6 | 5 | 77.4 | 82.4 | 88 | 70.8 | 58.8 | 81.8 | 93 | 75.4 | 69 | 31 | 76.9 | 62.6 | 61.5 | 82 | 82.1 |

FIG. 9A

| IF 405nm (5ea) | IF 365nm (10ea) | CCT | UVContent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|---|
| 60 | 10 | 6598 | 0 | 0.5 | 5.3 | 97.3 | 98.1 | 99.8 | 98.4 | 92.8 | 96.4 | 99.1 | 96.8 | 96.8 | 95 | 97.3 | 89.8 | 97.2 | 98.7 | 99 |
| 60 | 30 | 6614 | 0 | 0.5 | 5.1 | 97.3 | 97.9 | 99.9 | 98.4 | 92.9 | 96.4 | 98.9 | 96.9 | 96.8 | 94.4 | 97 | 89.8 | 97.1 | 98.5 | 99 |
| 60 | 60 | 6618 | 0 | 0.5 | 4.8 | 97.3 | 97.9 | 99.8 | 98.4 | 92.9 | 96.4 | 98.9 | 96.9 | 96.9 | 94.4 | 97 | 89.9 | 97.1 | 98.5 | 99 |
| 60 | 90 | 6619 | 0 | 0.5 | 4.5 | 97.3 | 97.8 | 99.8 | 98.4 | 92.9 | 96.4 | 98.9 | 97 | 96.9 | 94.3 | 97 | 89.9 | 97.1 | 98.5 | 99 |
| 60 | 120 | 6624 | 0 | 0.5 | 4.2 | 97.2 | 97.8 | 99.8 | 98.4 | 92.9 | 96.4 | 98.9 | 97 | 96.9 | 94.2 | 97 | 89.9 | 97.1 | 98.4 | 99 |
| 60 | 150 | 6627 | 0 | 0.5 | 3.9 | 97.2 | 97.8 | 99.8 | 98.4 | 92.9 | 96.4 | 98.8 | 97 | 96.9 | 94.2 | 96.9 | 89.9 | 97.1 | 98.4 | 99 |
| 60 | 180 | 6629 | 1.4 | 0.5 | 3.6 | 97.2 | 97.7 | 99.8 | 98.4 | 92.9 | 96.4 | 98.8 | 97 | 96.9 | 94.1 | 96.9 | 89.9 | 97.1 | 98.4 | 99 |
| 60 | 210 | 6630 | 10.1 | 0.5 | 3.4 | 97.2 | 97.7 | 99.7 | 98.4 | 92.9 | 96.4 | 98.8 | 97.1 | 96.9 | 94.1 | 96.9 | 89.9 | 97.1 | 98.4 | 99 |
| 60 | 240 | 6632 | 19.1 | 0.5 | 3.1 | 97.2 | 97.7 | 99.7 | 98.4 | 92.9 | 96.4 | 98.8 | 97.1 | 96.9 | 94.1 | 96.9 | 89.9 | 97.1 | 98.3 | 99 |
| 60 | 270 | 6635 | 27.8 | 0.4 | 2.8 | 97.2 | 97.7 | 99.7 | 98.4 | 92.9 | 96.4 | 98.8 | 97.1 | 97 | 94.1 | 96.9 | 90 | 97.1 | 98.3 | 99 |
| 60 | 300 | 6636 | 36.8 | 0.4 | 2.6 | 97.2 | 97.7 | 99.7 | 98.4 | 93 | 96.4 | 98.8 | 97.1 | 96.9 | 94 | 96.9 | 90 | 97 | 98.3 | 99 |
| 60 | 330 | 6638 | 44.5 | 0.4 | 2.3 | 97.2 | 97.6 | 99.7 | 98.4 | 93 | 96.4 | 98.7 | 97.1 | 97 | 94 | 96.9 | 90 | 97 | 98.3 | 99 |
| 60 | 360 | 6641 | 52.7 | 0.4 | 2.1 | 97.2 | 97.6 | 99.6 | 98.4 | 92.9 | 96.4 | 98.7 | 97.2 | 97 | 93.9 | 96.8 | 90 | 97.1 | 98.2 | 99 |
| 60 | 390 | 6647 | 59.5 | 0.4 | 1.9 | 97.2 | 97.6 | 99.6 | 98.4 | 92.9 | 96.3 | 98.7 | 97.2 | 96.9 | 93.7 | 96.8 | 89.9 | 97 | 98.2 | 99 |
| 60 | 420 | 6647 | 65.6 | 0.4 | 1.5 | 97.2 | 97.6 | 99.6 | 98.4 | 93 | 96.3 | 98.7 | 97.2 | 97 | 93.8 | 96.8 | 90 | 97 | 98.2 | 99 |
| 60 | 450 | 6650 | 73.3 | 0.4 | 1.5 | 97.2 | 97.5 | 99.6 | 98.4 | 93 | 96.3 | 98.6 | 97.2 | 97 | 93.8 | 96.8 | 90 | 97 | 98.2 | 99 |
| 60 | 480 | 6658 | 55.9 | 0.4 | 1.5 | 97.1 | 97.3 | 99.4 | 98.4 | 92.9 | 96.2 | 98.4 | 97.3 | 96.9 | 93 | 96.5 | 89.9 | 97.1 | 97.9 | 99 |
| 60 | 510 | 6659 | 76.9 | 0.4 | 1.4 | 97.2 | 97.4 | 99.4 | 98.4 | 93 | 96.3 | 98.5 | 97.3 | 97 | 93.4 | 96.6 | 90 | 97 | 98 | 99 |
| 60 | 540 | 6660 | 83.4 | 0.4 | 1.2 | 97.2 | 97.4 | 99.4 | 98.4 | 93 | 96.3 | 98.5 | 97.3 | 97 | 93.4 | 96.6 | 90 | 97 | 98 | 99 |
| 60 | 570 | 6662 | 85.3 | 0.4 | 1.2 | 97.1 | 97.3 | 99.4 | 98.4 | 93 | 96.3 | 98.5 | 97.3 | 97 | 93.4 | 96.6 | 90 | 97 | 98 | 99 |
| 60 | 600 | 6667 | 87.9 | 0.4 | 1.2 | 97.1 | 97.3 | 99.4 | 98.4 | 92.9 | 96.3 | 98.4 | 97.3 | 97 | 93.2 | 96.6 | 90 | 97 | 97.9 | 99 |
| 60 | 630 | 6665 | 99.2 | 0.4 | 1.2 | 97.1 | 97.3 | 99.4 | 98.4 | 92.9 | 96.2 | 98.4 | 97.3 | 96.9 | 93.1 | 96.6 | 90 | 97 | 97.9 | 99 |
| 60 | 660 | 6670 | 103.4 | 0.4 | 1.2 | 97.1 | 97.3 | 99.3 | 98.4 | 92.9 | 96.2 | 98.4 | 97.3 | 97 | 93.2 | 96.6 | 90 | 97 | 97.9 | 99 |
| 60 | 700 | 6672 | 115.6 | 0.4 | 1.4 | 97.1 | 97.3 | 99.4 | 98.4 | 92.9 | 96.2 | 98.4 | 97.3 | 97 | 93.2 | 96.6 | 90 | 97.1 | 97.9 | 99 |

FIG. 10A

| IF (mA) | UVContent | CCT | Mlvis | Mluv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 10 | 0 | 4996 | 0.5 | 4.2 | 98.5 | 98.7 | 98.8 | 98.5 | 96.8 | 98.3 | 98.8 | 99.1 | 98.8 | 97.5 | 96.4 | 93.5 | 89.9 | 97.9 | 98.8 |
| 30 | 10.1 | 4999 | 0.5 | 3.3 | 98.5 | 98.6 | 98.8 | 98.5 | 96.8 | 98.3 | 98.8 | 99.1 | 98.7 | 97.3 | 96.5 | 93.4 | 90.2 | 98 | 98.9 |
| 60 | 55.4 | 5008 | 0.5 | 1.9 | 97.8 | 98.2 | 99.6 | 98.9 | 94.3 | 96.9 | 98.3 | 97.9 | 98.5 | 97.8 | 96.8 | 91.2 | 97 | 98.6 | 99.2 |
| 65 | 64.5 | 5010 | 0.5 | 1.5 | 97.8 | 98.1 | 99.6 | 98.9 | 94.2 | 96.9 | 98.4 | 97.8 | 98.4 | 97.8 | 96.9 | 91.1 | 97 | 98.6 | 99.2 |
| 70 | 73.7 | 5012 | 0.5 | 1.3 | 97.7 | 98.1 | 99.6 | 98.9 | 94.1 | 96.8 | 98.3 | 97.8 | 98.4 | 97.6 | 96.9 | 91.1 | 97.1 | 98.6 | 99.2 |
| 75 | 81.8 | 5014 | 0.5 | 1.1 | 97.7 | 98.1 | 99.6 | 98.9 | 94 | 96.8 | 98.3 | 97.7 | 98.4 | 97.5 | 96.9 | 91 | 97.2 | 98.5 | 99.2 |
| 80 | 88.1 | 5015 | 0.5 | 0.9 | 97.7 | 98 | 99.6 | 98.9 | 94 | 96.7 | 98.3 | 97.7 | 98.4 | 97.4 | 96.9 | 91.1 | 97.3 | 98.5 | 99.2 |
| 85 | 96.4 | 5016 | 0.5 | 0.8 | 97.7 | 98 | 99.5 | 98.9 | 94 | 96.7 | 98.3 | 97.7 | 98.4 | 97.4 | 96.9 | 91 | 97.4 | 98.5 | 99.2 |
| 90 | 102.2 | 5019 | 0.5 | 0.9 | 97.7 | 98 | 99.5 | 98.9 | 93.9 | 96.7 | 98.3 | 97.7 | 98.4 | 97.4 | 96.9 | 91 | 97.4 | 98.5 | 99.2 |
| 95 | 109.6 | 5018 | 0.5 | 1.1 | 97.7 | 98 | 99.5 | 98.9 | 93.9 | 96.7 | 98.3 | 97.7 | 98.4 | 97.3 | 96.9 | 91 | 97.5 | 98.5 | 99.2 |
| 100 | 115.6 | 5019 | 0.5 | 1.2 | 97.6 | 98 | 99.5 | 98.9 | 93.8 | 96.7 | 98.3 | 97.6 | 98.3 | 97.3 | 96.9 | 90.9 | 97.5 | 98.5 | 99.2 |
| 105 | 124 | 5021 | 0.5 | 1.4 | 97.6 | 98 | 99.5 | 98.9 | 93.8 | 96.7 | 98.3 | 97.6 | 98.3 | 97.2 | 96.9 | 90.9 | 97.6 | 98.5 | 99.2 |
| 110 | 129.8 | 5023 | 0.5 | 1.5 | 97.6 | 98 | 99.5 | 98.9 | 93.8 | 96.6 | 98.3 | 97.6 | 98.3 | 97.1 | 96.9 | 90.9 | 97.7 | 98.4 | 99.2 |
| 115 | 138.6 | 5026 | 0.5 | 1.8 | 97.6 | 97.9 | 99.5 | 98.8 | 93.7 | 96.6 | 98.3 | 97.6 | 98.3 | 97.1 | 96.9 | 90.9 | 97.8 | 98.4 | 99.2 |
| 120 | 141.6 | 5023 | 0.5 | 1.8 | 97.6 | 98 | 99.5 | 98.9 | 93.8 | 96.6 | 98.2 | 97.7 | 98.4 | 97.2 | 96.8 | 90.9 | 97.9 | 98.5 | 99.2 |
| 150 | 186 | 5034 | 0.5 | 2.9 | 97.5 | 97.9 | 99.5 | 98.8 | 93.6 | 96.5 | 98.1 | 97.6 | 98.3 | 97 | 96.8 | 90.8 | 98.3 | 98.4 | 99.2 |
| 180 | 226.4 | 5042 | 0.5 | 3.8 | 97.4 | 97.8 | 99.4 | 98.8 | 93.3 | 96.3 | 98 | 97.5 | 98.2 | 96.7 | 96.8 | 90.7 | 98.7 | 98.3 | 99.2 |
| 210 | 264.7 | 5050 | 0.5 | 4.7 | 97.3 | 97.7 | 99.4 | 98.7 | 93.1 | 96.2 | 97.9 | 97.4 | 98.1 | 96.4 | 96.8 | 90.5 | 99.1 | 98.1 | 99.2 |
| 240 | 302.3 | 5061 | 0.5 | 5.6 | 97.2 | 97.6 | 99.3 | 98.6 | 92.9 | 96.1 | 97.8 | 97.2 | 97.9 | 96.1 | 96.9 | 90.4 | 99.4 | 98 | 99.2 |
| 270 | 331.7 | 5069 | 0.5 | 6.3 | 97 | 97.5 | 99.2 | 98.6 | 92.6 | 95.9 | 97.6 | 97.1 | 97.7 | 96.7 | 96.8 | 90.2 | 99.4 | 97.8 | 99.1 |
| 300 | 367.6 | 5076 | 0.5 | 7.1 | 96.9 | 97.4 | 99.2 | 98.5 | 92.4 | 96.8 | 97.5 | 97 | 97.6 | 95.5 | 96.8 | 90.1 | 99.1 | 97.7 | 99.1 |
| 330 | 396.3 | 5089 | 0.6 | 7.7 | 96.8 | 97.3 | 99.1 | 98.4 | 92.1 | 95.5 | 97.3 | 96.8 | 97.3 | 95 | 96.9 | 89.9 | 98.7 | 97.5 | 99.1 |
| 360 | 425.9 | 5097 | 0.6 | 8.5 | 96.6 | 97.3 | 99 | 98.3 | 91.9 | 95.4 | 97.2 | 96.7 | 97.2 | 94.8 | 96.8 | 89.8 | 98.4 | 97.4 | 99 |
| 390 | 450.1 | 5105 | 0.6 | 9.1 | 96.5 | 97.1 | 99 | 98.2 | 91.7 | 95.2 | 97 | 96.6 | 97 | 94.4 | 96.8 | 89.7 | 97.8 | 97.2 | 99 |
| 420 | 473.4 | 5112 | 0.7 | 9.8 | 96.4 | 97 | 98.9 | 98.1 | 91.4 | 95.1 | 96.9 | 96.5 | 96.8 | 94 | 96.8 | 89.5 | 97.4 | 97 | 98.9 |
| 450 | 494.4 | 5126 | 0.7 | 10.3 | 96.2 | 96.9 | 98.9 | 98 | 91.2 | 95 | 96.7 | 96.4 | 96.6 | 93.7 | 96.7 | 89.3 | 96.9 | 96.9 | 98.8 |
| 480 | 494.3 | 5136 | 0.7 | 10.4 | 96.1 | 96.8 | 98.7 | 97.9 | 90.9 | 94.8 | 96.7 | 96.2 | 96.5 | 93.5 | 96.8 | 89.2 | 96.5 | 96.7 | 98.8 |
| 510 | 529.5 | 5143 | 0.7 | 11.2 | 96 | 96.8 | 98.7 | 97.8 | 90.7 | 94.6 | 96.5 | 96.1 | 96.3 | 93.3 | 96.8 | 89.1 | 96.1 | 96.6 | 98.7 |
| 540 | 542.4 | 5153 | 0.8 | 11.6 | 95.9 | 96.7 | 98.6 | 97.7 | 90.7 | 94.4 | 96.4 | 96 | 96.2 | 93 | 96.8 | 89 | 95.7 | 96.5 | 98.6 |
| 570 | 541.7 | 5159 | 0.8 | 11.7 | 95.7 | 96.6 | 98.6 | 97.6 | 90.3 | 94.6 | 96.4 | 95.8 | 96.1 | 92.8 | 96.8 | 88.9 | 95.2 | 96.3 | 98.6 |
| 600 | 510.8 | 5169 | 0.8 | 11 | 95.6 | 96.5 | 98.5 | 97.4 | 90.1 | 94.5 | 96.4 | 95.7 | 95.9 | 92.2 | 96.7 | 88.7 | 94.9 | 96.2 | 98.5 |

| NO | HIGH COLOR RENDERING WHITE LIGHT-EMITTING DIODE (LED) DEVICE | | ULTRAVIOLET LIGHT-EMITTING DIODE (LED) DEVICE | | BLUE LIGHT-EMITTING DIODE (LED) DEVICE | METAMERISM INDEX | | | CCT | Ra | CRI | | | | | | | | | | | | | |
|---|---|---|---|---|---|---|---|---|---|---|---|---|---|---|---|---|---|---|---|---|---|---|---|---|
| | 400nm~440nm | 440nm~460nm | 300nm~400nm | 400nm~470nm | | Mi-Vis | Mi-UV | UVContent | | | R1 | R2 | R3 | R4 | R5 | R6 | R7 | R8 | R9 | R10 | R11 | R12 | R13 | R14 |
| EXAMPLE 1 | x | x | o | o | x | 0.7 | 1.5 | 82.9 | 6429 | 98.3 | 98.3 | 99 | 96.2 | 95.9 | 97.7 | 96.3 | 99.5 | 99.2 | 97.7 | 95.1 | 92.2 | 92.1 | 98.3 | 98.3 |
| EXAMPLE 2 | x | o | o | o | o | 0.5 | 0.8 | 129.5 | 6306 | 95.7 | 95.3 | 98 | 97.8 | 91 | 94.9 | 96.7 | 96.6 | 95.4 | 88.9 | 94.9 | 87.5 | 95.4 | 96 | 98.6 |
| EXAMPLE 3 | o | o | o | o | x | 0.6 | 0.9 | 144.8 | 6580 | 97 | 96.7 | 98.8 | 99.6 | 93.1 | 96.4 | 97.4 | 97.7 | 97.5 | 93.9 | 95.8 | 89.4 | 92.4 | 97.3 | 98.9 |
| EXAMPLE 4 | o | o | o | o | o | 0.6 | 0.9 | 129.6 | 6701 | 94.6 | 93.7 | 97.2 | 96.9 | 89.5 | 93.7 | 95.8 | 95.9 | 93.7 | 83.6 | 93.9 | 85.7 | 94.3 | 94.5 | 98.1 |
| EXAMPLE 5 | o | o | o | o | x | 0.4 | 1.0 | 95.1 | 6944 | 97.6 | 97.2 | 97.8 | 96.2 | 97.6 | 97.6 | 96.8 | 97.7 | 97.8 | 98.2 | 94.7 | 95.9 | 93.7 | 97 | 98.8 |

FIG. 15A

| IF(mA) | CCT | UVContent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 170 | 6300 | 82.5 | 0.5 | 1.4 | 95.8 | 95.4 | 98.2 | 97.8 | 91 | 94.9 | 96.8 | 96.5 | 95.4 | 89.1 | 95.1 | 87.5 | 95.6 | 96.1 | 98.6 |
| 180 | 6303 | 91 | 0.5 | 1.2 | 95.7 | 95.4 | 98.1 | 97.8 | 91 | 94.9 | 96.8 | 96.5 | 95.4 | 89 | 95 | 87.5 | 95.5 | 96.1 | 98.6 |
| 190 | 6305 | 98.3 | 0.5 | 1 | 95.7 | 95.3 | 98.1 | 97.8 | 91.1 | 94.9 | 96.8 | 96.5 | 95.4 | 88.9 | 95 | 87.6 | 95.5 | 96 | 98.6 |
| 200 | 6305 | 105.6 | 0.5 | 0.9 | 95.8 | 95.4 | 98.1 | 97.8 | 91 | 94.9 | 96.8 | 96.5 | 95.4 | 89.1 | 95 | 87.5 | 95.4 | 96.1 | 98.6 |
| 210 | 6303 | 113.5 | 0.5 | 0.8 | 95.7 | 95.3 | 98.1 | 97.8 | 91 | 94.9 | 96.7 | 96.6 | 95.4 | 89 | 95 | 87.5 | 95.4 | 96 | 98.6 |
| 220 | 6306 | 129.5 | 0.5 | 0.8 | 95.7 | 95.3 | 98 | 97.8 | 91 | 94.9 | 96.7 | 96.6 | 95.4 | 88.9 | 94.9 | 87.5 | 95.4 | 96 | 98.6 |
| 230 | 6312 | 136.5 | 0.5 | 0.9 | 95.7 | 95.3 | 98 | 97.8 | 91 | 94.9 | 96.7 | 96.7 | 95.4 | 88.8 | 94.9 | 87.5 | 95.4 | 96 | 98.6 |
| 240 | 6322 | 139.2 | 0.5 | 0.9 | 95.7 | 95.2 | 98 | 97.8 | 91.1 | 94.8 | 96.6 | 96.7 | 95.4 | 88.6 | 94.8 | 87.5 | 95.2 | 95.9 | 98.6 |
| 250 | 6312 | 143.5 | 0.5 | 1 | 95.8 | 95.3 | 98.1 | 97.8 | 91.1 | 94.9 | 96.7 | 96.6 | 95.5 | 89 | 95 | 87.6 | 95.3 | 96 | 98.6 |
| 260 | 6310 | 151.5 | 0.5 | 1.2 | 95.7 | 95.3 | 98 | 97.8 | 91.1 | 94.9 | 96.7 | 96.6 | 95.5 | 88.9 | 94.9 | 87.6 | 95.3 | 96 | 98.6 |

FIG. 15B

| IF(mA) | CCT | UvContent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 250 | 6571 | 113.7 | 0.6 | 1.1 | 97 | 96.8 | 98.9 | 98.6 | 93.1 | 96.4 | 97.5 | 97.6 | 97.4 | 94.1 | 96 | 89.4 | 92.6 | 97.4 | 98.9 |
| 260 | 9574 | 120.4 | 0.6 | 1.1 | 97 | 96.8 | 98.9 | 98.6 | 93.1 | 96.4 | 97.4 | 97.6 | 97.4 | 94 | 95.9 | 89.4 | 92.5 | 97.4 | 98.9 |
| 270 | 6577 | 126.2 | 0.6 | 1 | 97 | 96.8 | 98.9 | 98.6 | 93.1 | 96.4 | 97.4 | 97.6 | 97.5 | 94 | 95.9 | 89.4 | 92.5 | 97.3 | 98.9 |
| 280 | 6577 | 133.2 | 0.6 | 1 | 97 | 96.7 | 98.8 | 98.6 | 93.1 | 96.4 | 97.4 | 97.6 | 97.4 | 94 | 95.8 | 89.4 | 92.5 | 97.3 | 98.9 |
| 290 | 6580 | 138.2 | 0.6 | 1 | 97 | 96.7 | 98.8 | 98.6 | 93.1 | 96.4 | 97.4 | 97.6 | 97.5 | 93.8 | 95.8 | 89.4 | 92.5 | 97.3 | 98.9 |
| 300 | 6580 | 144.8 | 0.6 | 0.9 | 97 | 96.7 | 98.8 | 98.6 | 93.1 | 96.4 | 97.4 | 97.7 | 97.5 | 93.9 | 95.8 | 89.4 | 92.4 | 97.3 | 98.9 |
| 310 | 6580 | 151.8 | 0.6 | 1 | 97 | 96.7 | 98.8 | 98.6 | 93.1 | 96.4 | 97.3 | 97.7 | 97.5 | 93.9 | 95.8 | 89.4 | 92.4 | 97.3 | 98.9 |
| 320 | 6579 | 158.5 | 0.6 | 1.1 | 97 | 96.7 | 98.8 | 98.6 | 93.1 | 96.4 | 97.3 | 97.7 | 97.5 | 93.8 | 95.8 | 89.5 | 92.4 | 97.3 | 98.9 |
| 330 | 6583 | 165.1 | 0.6 | 1.2 | 97 | 96.7 | 98.8 | 98.6 | 93.2 | 96.4 | 97.3 | 97.7 | 97.5 | 93.9 | 95.8 | 89.5 | 92.4 | 97.2 | 98.9 |

FIG. 15C

| IF(mA) | CCT | UvContent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 150 | 6689 | 43 | 0.6 | 2.7 | 94.5 | 93.8 | 97.3 | 96.9 | 89.4 | 93.8 | 95.9 | 95.7 | 93.6 | 83.7 | 94 | 85.6 | 94.6 | 94.7 | 98.1 |
| 170 | 6695 | 58 | 0.6 | 2.3 | 94.5 | 93.7 | 97.3 | 96.9 | 89.4 | 93.7 | 95.8 | 95.8 | 93.6 | 83.6 | 93.9 | 85.6 | 94.5 | 94.6 | 98.1 |
| 200 | 6695 | 79.1 | 0.6 | 1.7 | 94.5 | 93.7 | 97.2 | 96.9 | 89.4 | 93.7 | 95.8 | 95.9 | 93.6 | 83.4 | 93.8 | 85.6 | 94.4 | 94.5 | 98.1 |
| 230 | 6700 | 101.6 | 0.6 | 1.1 | 94.5 | 93.7 | 97.2 | 96.9 | 89.4 | 93.7 | 95.8 | 95.9 | 93.6 | 83.4 | 93.8 | 85.6 | 94.4 | 94.5 | 98.1 |
| 250 | 6702 | 115.9 | 0.6 | 1 | 94.5 | 93.7 | 97.2 | 96.9 | 89.4 | 93.7 | 95.8 | 95.9 | 93.6 | 83.4 | 93.8 | 85.7 | 94.4 | 94.5 | 98.1 |
| 260 | 6702 | 122.3 | 0.6 | 0.9 | 94.5 | 93.7 | 97.2 | 96.9 | 89.5 | 93.7 | 95.7 | 95.9 | 93.6 | 83.4 | 93.8 | 85.7 | 94.3 | 94.5 | 98.1 |
| 270 | 6701 | 129.6 | 0.6 | 0.9 | 94.6 | 93.7 | 97.2 | 96.9 | 89.5 | 93.7 | 95.8 | 95.9 | 93.7 | 83.6 | 93.9 | 85.7 | 94.3 | 94.5 | 98.1 |
| 280 | 6703 | 135.7 | 0.6 | 1 | 94.5 | 93.7 | 97.2 | 96.9 | 89.5 | 93.7 | 95.7 | 96 | 93.7 | 83.5 | 93.8 | 85.7 | 94.3 | 94.5 | 98.1 |
| 290 | 6701 | 143.7 | 0.6 | 1.1 | 94.5 | 93.6 | 97.2 | 96.9 | 89.4 | 93.6 | 95.7 | 96 | 93.6 | 83.3 | 93.8 | 85.7 | 94.3 | 94.4 | 98 |
| 300 | 6703 | 148.8 | 0.6 | 1.2 | 94.5 | 93.6 | 97.2 | 96.9 | 89.4 | 93.7 | 95.7 | 96 | 93.6 | 83.4 | 93.8 | 85.7 | 94.2 | 94.4 | 98.1 |

FIG. 15D

| IF(mA) | CCT | UVContent | MIvis | MIuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 130 | 6954 | 72 | 0.4 | 1.3 | 97.5 | 97.1 | 97.7 | 98.2 | 97.6 | 97.5 | 96.7 | 97.7 | 97.7 | 98.1 | 94.6 | 95.8 | 93.7 | 96.9 | 98.8 |
| 140 | 6937 | 77 | 0.4 | 1.2 | 97.6 | 97.2 | 97.7 | 98.2 | 97.6 | 97.6 | 96.8 | 97.6 | 97.8 | 98.2 | 94.7 | 95.9 | 93.6 | 97 | 98.8 |
| 150 | 6938 | 84.2 | 0.4 | 1.1 | 97.6 | 97.2 | 97.8 | 98.1 | 97.6 | 97.6 | 96.8 | 97.6 | 97.8 | 98.2 | 94.7 | 96 | 93.6 | 97 | 98.8 |
| 160 | 6944 | 95.1 | 0.4 | 1 | 97.6 | 97.2 | 97.8 | 98.2 | 97.6 | 97.6 | 96.8 | 97.7 | 97.8 | 98.2 | 94.7 | 95.9 | 93.7 | 97 | 98.8 |
| 170 | 6952 | 103.7 | 0.4 | 1.1 | 97.6 | 97.2 | 97.8 | 98.2 | 97.6 | 97.6 | 96.8 | 97.7 | 97.8 | 98.3 | 94.8 | 95.9 | 93.7 | 97 | 98.8 |
| 180 | 6944 | 112.3 | 0.4 | 1.2 | 97.6 | 97.1 | 97.8 | 98.2 | 97.6 | 97.5 | 96.8 | 97.7 | 97.8 | 98.2 | 94.7 | 95.9 | 93.8 | 97 | 98.8 |
| 190 | 6959 | 120.7 | 0.4 | 1.3 | 97.6 | 97.2 | 97.8 | 98.2 | 97.6 | 97.6 | 96.8 | 97.7 | 97.8 | 98.3 | 94.8 | 95.9 | 93.8 | 97 | 98.8 |

FIG. 16

| NO | HIGH COLOR RENDERING WHITE LIGHT-EMITTING DIODE (LED) DEVICE | | ULTRAVIOLET LIGHT-EMITTING DIODE (LED) DEVICE | BLUE LIGHT-EMITTING DIODE (LED) DEVICE | METAMERISM INDEX | | | CCT | CRI | | | | | | | | | | | | | |
|---|---|---|---|---|---|---|---|---|---|---|---|---|---|---|---|---|---|---|---|---|---|---|
| WD | 400nm~440nm | 440nm~450nm | 300nm~400nm | 400nm~470nm | MI-Vis | MI-Uv | UVContent | | Ra | R1 | R2 | R3 | R4 | R5 | R6 | R7 | R8 | R9 | R10 | R11 | R12 | R13 | R14 |
| EXAMPLE 1 | X | O | O | X | 0.5 | 0.8 | 96.4 | 5016 | 97.7 | 98 | 99.5 | 98.9 | 94 | 96.7 | 96.3 | 97.7 | 96.4 | 97.4 | 96.9 | 91 | 97.4 | 98.5 | 99.2 |
| EXAMPLE 2 | X | O | O | O | 0.5 | 0.6 | 114.9 | 5103 | 95.7 | 95.3 | 98 | 97.8 | 91 | 94.9 | 96.7 | 96.6 | 95.4 | 86.9 | 94.9 | 87.5 | 95.4 | 96 | 98.6 |
| EXAMPLE 3 | O | O | O | X | 0.5 | 0.6 | 114.2 | 5029 | 97.4 | 98.2 | 99 | 97.2 | 94 | 97.7 | 98 | 97 | 96.1 | 98.7 | 96.5 | 91.8 | 95.2 | 98.5 | 98.3 |
| EXAMPLE 4 | O | O | O | O | 0.4 | 0.6 | 110.4 | 5092 | 94.6 | 93.7 | 97.2 | 96.9 | 93.5 | 93.7 | 95.8 | 95.9 | 93.7 | 93.6 | 93.9 | 85.7 | 94.3 | 94.5 | 98.1 |
| EXAMPLE 5 | O | X | O | O | 0.5 | 0.7 | 110.6 | 5110 | 96.5 | 95.1 | 97.8 | 97.2 | 96.5 | 96.8 | 98 | 97.3 | 93.6 | 92 | 97 | 95.9 | 91 | 95.4 | 97.7 |

FIG. 17A

| IF(mA) | CCT | UVContent | Mvis | Muv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 200 | 5073 | 48.1 | 0.5 | 2.3 | 96.5 | 96.5 | 98.7 | 98.5 | 91.8 | 95.4 | 97.5 | 96.8 | 96.5 | 92.8 | 95.4 | 88.4 | 97.5 | 97.1 | 98.9 |
| 250 | 5076 | 70.7 | 0.5 | 1.6 | 96.5 | 96.4 | 98.7 | 98.5 | 91.9 | 95.4 | 97.4 | 96.9 | 96.6 | 92.7 | 95.3 | 88.5 | 97.2 | 97 | 98.9 |
| 270 | 5080 | 79.2 | 0.5 | 1.4 | 96.4 | 96.4 | 98.6 | 98.5 | 91.9 | 95.4 | 97.3 | 96.9 | 96.6 | 92.6 | 95.2 | 88.4 | 97.2 | 97 | 98.9 |
| 280 | 5082 | 83.9 | 0.5 | 1.3 | 96.5 | 96.4 | 98.6 | 98.5 | 91.9 | 95.4 | 97.3 | 96.9 | 96.6 | 92.7 | 95.3 | 88.5 | 97.1 | 97 | 98.9 |
| 290 | 5085 | 88.5 | 0.5 | 1.1 | 96.4 | 96.3 | 98.5 | 98.5 | 91.9 | 95.4 | 97.2 | 97 | 96.6 | 92.5 | 95.1 | 88.5 | 96.9 | 96.9 | 98.9 |
| 300 | 5082 | 93 | 0.5 | 1 | 96.4 | 96.3 | 98.6 | 98.5 | 91.9 | 95.4 | 97.3 | 96.9 | 96.6 | 92.7 | 95.2 | 88.5 | 97.1 | 96.9 | 98.9 |
| 310 | 5089 | 96.3 | 0.5 | 0.9 | 96.4 | 96.2 | 98.5 | 98.5 | 92 | 95.4 | 97.2 | 97 | 96.6 | 92.5 | 95.1 | 88.5 | 96.8 | 96.8 | 98.9 |
| 320 | 5086 | 98.7 | 0.5 | 0.9 | 96.4 | 96.3 | 98.5 | 98.5 | 91.9 | 95.4 | 97.2 | 97 | 96.6 | 92.5 | 95.1 | 88.5 | 96.9 | 96.8 | 98.9 |
| 330 | 5087 | 101.8 | 0.5 | 0.8 | 96.4 | 96.2 | 98.5 | 98.5 | 91.9 | 95.4 | 97.2 | 97 | 96.6 | 92.5 | 95.1 | 88.5 | 96.8 | 96.8 | 98.9 |
| 340 | 5091 | 102.8 | 0.5 | 0.8 | 96.4 | 96.2 | 98.4 | 98.5 | 92 | 95.4 | 97.1 | 97.1 | 96.6 | 92.3 | 95 | 88.5 | 96.7 | 96.7 | 98.9 |
| 350 | 5092 | 102.4 | 0.5 | 0.8 | 96.4 | 96.1 | 98.4 | 98.5 | 92 | 95.3 | 97.1 | 97.1 | 96.6 | 92.3 | 95 | 88.5 | 96.6 | 96.7 | 98.9 |
| 360 | 5093 | 110.2 | 0.5 | 0.7 | 96.4 | 96.1 | 98.4 | 98.5 | 92 | 95.4 | 97.1 | 97.1 | 96.7 | 92.3 | 95 | 88.6 | 96.6 | 96.7 | 98.9 |
| 370 | 5095 | 110.9 | 0.5 | 0.6 | 96.4 | 96.1 | 98.3 | 98.5 | 92 | 95.3 | 97 | 97.2 | 96.6 | 92.2 | 94.9 | 88.6 | 96.5 | 96.6 | 98.9 |
| 380 | 5103 | 114.9 | 0.5 | 0.6 | 96.4 | 96 | 98.3 | 98.5 | 92 | 95.3 | 97 | 97.2 | 96.6 | 92.1 | 94.9 | 88.5 | 96.5 | 96.6 | 98.9 |
| 390 | 5097 | 116 | 0.5 | 0.6 | 96.4 | 96.1 | 98.4 | 98.5 | 92 | 95.4 | 97 | 97.2 | 96.7 | 92.2 | 95 | 88.6 | 96.4 | 96.6 | 98.9 |
| 400 | 5096 | 118.4 | 0.5 | 0.8 | 96.4 | 96 | 98.3 | 98.6 | 92 | 95.3 | 97 | 97.2 | 96.7 | 92.1 | 94.9 | 88.6 | 96.4 | 96.6 | 98.9 |
| 410 | 5099 | 120.5 | 0.5 | 0.8 | 96.4 | 96 | 98.3 | 98.6 | 92 | 95.3 | 97 | 97.2 | 96.7 | 92.1 | 94.9 | 88.6 | 96.4 | 96.6 | 98.9 |
| 420 | 5099 | 122.8 | 0.5 | 0.9 | 96.4 | 96 | 98.3 | 98.6 | 92 | 95.3 | 97 | 97.2 | 96.7 | 92.1 | 94.8 | 88.6 | 96.3 | 96.6 | 98.9 |
| 430 | 5098 | 125 | 0.5 | 0.9 | 96.4 | 96 | 98.3 | 98.6 | 92.1 | 95.3 | 97 | 97.2 | 96.7 | 92.1 | 94.8 | 88.6 | 96.3 | 96.6 | 98.9 |

FIG. 17B

| IF(mA) | CCT | UVContent | Mlvis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 200 | 5024 | 73.4 | 0.4 | 1.4 | 97.4 | 98.3 | 99 | 97.3 | 94 | 97.7 | 98.1 | 97 | 98.1 | 98.7 | 98.6 | 91.8 | 95.2 | 98.7 | 98.4 |
| 210 | 5025 | 79.3 | 0.4 | 1.2 | 97.4 | 98.3 | 99 | 97.2 | 94 | 97.7 | 98.1 | 97 | 98.1 | 98.6 | 98.6 | 91.8 | 95.2 | 98.6 | 98.4 |
| 220 | 5028 | 83.8 | 0.4 | 1.1 | 97.4 | 98.2 | 99 | 97.3 | 94.1 | 97.7 | 98.1 | 97 | 98.1 | 98.7 | 98.6 | 91.8 | 95.2 | 98.6 | 98.4 |
| 230 | 5028 | 89.6 | 0.4 | 1 | 97.4 | 98.2 | 99 | 97.2 | 94 | 97.7 | 98 | 97 | 98.1 | 98.7 | 98.6 | 91.8 | 95.2 | 98.6 | 98.3 |
| 240 | 5028 | 94.6 | 0.4 | 0.8 | 97.4 | 98.2 | 99 | 97.2 | 94.1 | 97.7 | 98 | 97 | 98.1 | 98.6 | 98.6 | 91.9 | 95.2 | 98.6 | 98.3 |
| 250 | 5021 | 96 | 0.4 | 0.8 | 97.4 | 98.3 | 99 | 97.3 | 94 | 97.7 | 98.2 | 96.9 | 98.1 | 98.8 | 98.7 | 91.8 | 95.4 | 98.7 | 98.4 |
| 260 | 5028 | 104 | 0.4 | 0.6 | 97.4 | 98.2 | 99 | 97.2 | 94.1 | 97.7 | 98 | 97 | 98.1 | 98.6 | 98.5 | 91.9 | 95.1 | 98.6 | 98.3 |
| 270 | 5030 | 109 | 0.4 | 0.6 | 97.4 | 98.2 | 99 | 97.2 | 94 | 97.7 | 98 | 97 | 98.1 | 98.7 | 98.5 | 91.8 | 95.2 | 98.5 | 98.3 |
| 280 | 5029 | 114.2 | 0.4 | 0.6 | 97.4 | 98.2 | 98.9 | 97.2 | 94.1 | 97.7 | 98 | 97 | 98.2 | 98.6 | 98.5 | 91.9 | 95.1 | 98.5 | 98.3 |
| 290 | 5034 | 118.4 | 0.4 | 0.7 | 97.4 | 98.2 | 98.9 | 97.2 | 94.1 | 97.7 | 98 | 97 | 98.2 | 98.6 | 98.5 | 91.9 | 95.1 | 98.6 | 98.3 |
| 300 | 5031 | 124.2 | 0.4 | 0.8 | 97.4 | 98.2 | 98.9 | 97.2 | 94 | 97.7 | 98 | 97 | 98.2 | 98.7 | 98.5 | 91.9 | 95.2 | 98.5 | 98.3 |
| 310 | 5032 | 129.1 | 0.4 | 0.9 | 97.4 | 98.2 | 98.9 | 97.2 | 94 | 97.7 | 98 | 97 | 98.2 | 98.6 | 98.5 | 91.9 | 95.1 | 98.5 | 98.3 |
| 320 | 5036 | 133.9 | 0.4 | 0.9 | 97.4 | 98.2 | 98.9 | 97.2 | 94.1 | 97.7 | 98.1 | 97 | 98.2 | 98.6 | 98.5 | 91.9 | 95.1 | 98.5 | 98.3 |
| 330 | 5036 | 138.4 | 0.4 | 1 | 97.4 | 98.2 | 98.9 | 97.2 | 94.1 | 97.7 | 98.1 | 97 | 98.2 | 98.6 | 98.5 | 91.9 | 95.1 | 98.5 | 98.3 |

FIG. 17C

| IF(mA) | CCT | UVCont ent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 140 | 5074 | 24.4 | 0.5 | 2.9 | 96.1 | 95.8 | 98.1 | 96.7 | 92.6 | 96 | 96.6 | 96.9 | 96.5 | 92.4 | 96.8 | 89.8 | 93.6 | 96.3 | 97.9 |
| 200 | 5077 | 52.3 | 0.5 | 2.1 | 96.1 | 95.7 | 98.1 | 96.7 | 92.6 | 95.9 | 96.6 | 96.9 | 96.5 | 92.2 | 96.8 | 89.8 | 93.6 | 96.2 | 97.9 |
| 250 | 5082 | 74.4 | 0.5 | 1.5 | 96.1 | 95.7 | 98 | 96.6 | 92.6 | 95.9 | 96.6 | 96.9 | 96.5 | 92.2 | 96.8 | 89.8 | 93.6 | 96.2 | 97.8 |
| 290 | 5087 | 92.2 | 0.5 | 1 | 96.1 | 95.7 | 98 | 96.6 | 92.6 | 95.9 | 96.6 | 97 | 96.5 | 92.3 | 96.7 | 89.8 | 93.6 | 96.2 | 97.8 |
| 300 | 5086 | 97.5 | 0.5 | 0.9 | 96.1 | 95.7 | 98 | 96.6 | 92.6 | 95.9 | 96.6 | 96.9 | 96.5 | 92.3 | 96.8 | 89.8 | 93.6 | 96.2 | 97.8 |
| 310 | 5089 | 101.7 | 0.5 | 0.8 | 96.1 | 95.6 | 98 | 96.6 | 92.6 | 95.9 | 96.5 | 97 | 96.6 | 92.3 | 96.7 | 89.9 | 93.5 | 96.2 | 97.8 |
| 320 | 5094 | 105.6 | 0.5 | 0.6 | 96.1 | 95.6 | 98 | 96.6 | 92.6 | 95.9 | 96.5 | 97 | 96.6 | 92.2 | 96.7 | 89.8 | 93.5 | 96.1 | 97.8 |
| 330 | 5092 | 110.4 | 0.5 | 0.6 | 96.1 | 95.6 | 98 | 96.6 | 92.6 | 95.9 | 96.5 | 97 | 96.6 | 92.2 | 96.7 | 89.9 | 93.5 | 96.1 | 97.8 |
| 340 | 5095 | 113.9 | 0.5 | 0.7 | 96.1 | 95.6 | 97.9 | 96.6 | 92.6 | 95.9 | 96.5 | 97 | 96.6 | 92.2 | 96.7 | 89.9 | 93.4 | 96.1 | 97.8 |
| 350 | 5096 | 118.9 | 0.5 | 0.8 | 96.1 | 95.6 | 97.9 | 96.6 | 92.6 | 95.9 | 96.5 | 97 | 96.6 | 92.2 | 96.6 | 89.9 | 93.4 | 96.1 | 97.8 |
| 360 | 5096 | 122.2 | 0.5 | 0.8 | 96.1 | 95.6 | 97.9 | 96.6 | 92.6 | 95.9 | 96.4 | 97 | 96.6 | 92.2 | 96.6 | 89.9 | 93.4 | 96.1 | 97.8 |
| 370 | 5098 | 125.5 | 0.5 | 0.9 | 96.1 | 95.5 | 97.9 | 96.6 | 92.6 | 95.9 | 96.4 | 97 | 96.6 | 92.1 | 96.6 | 89.9 | 93.4 | 96 | 97.8 |
| 380 | 5098 | 131.6 | 0.5 | 0.9 | 96.1 | 95.6 | 97.9 | 96.6 | 92.6 | 95.9 | 96.4 | 97 | 96.6 | 92.2 | 96.6 | 89.9 | 93.4 | 96.1 | 97.8 |
| 390 | 5100 | 134.1 | 0.5 | 1 | 96.1 | 95.5 | 97.9 | 96.6 | 92.6 | 95.9 | 96.4 | 97 | 96.6 | 92.1 | 96.6 | 89.9 | 93.4 | 96 | 97.8 |
| 400 | 5104 | 135.5 | 0.5 | 1.1 | 96.1 | 95.5 | 97.9 | 96.6 | 92.6 | 95.9 | 96.4 | 97 | 96.6 | 92.1 | 96.6 | 89.9 | 93.4 | 96 | 97.8 |

FIG. 17D

| IF(mA) | CCT | UVContent | Mivis | Miuv | Ra | R1 | R2 | R3 | R4 | R5 | R6 | R7 | R8 | R9 | R10 | R11 | R12 | R13 | R14 |
|---|---|---|---|---|---|---|---|---|---|---|---|---|---|---|---|---|---|---|---|
| 95 | 5042 | 77.9 | 0.5 | 1.3 | 96.4 | 94.9 | 97.6 | 97.3 | 96.5 | 96.7 | 97.9 | 97.1 | 93.3 | 81.1 | 96.5 | 95.9 | 90.5 | 95.1 | 97.8 |
| 100 | 5136 | 83.1 | 0.5 | 1.1 | 96.4 | 95 | 97.6 | 97.3 | 96.5 | 96.7 | 97.9 | 97.1 | 93.3 | 81.3 | 96.6 | 95.9 | 90.6 | 95.2 | 97.8 |
| 103 | 5119 | 87.5 | 0.5 | 1 | 96.5 | 95 | 97.7 | 97.2 | 96.5 | 96.7 | 98 | 97.3 | 93.5 | 81.7 | 96.9 | 95.9 | 90.9 | 95.3 | 97.8 |
| 105 | 5128 | 90.1 | 0.5 | 0.9 | 96.5 | 95 | 97.7 | 97.3 | 96.5 | 96.7 | 98 | 97.2 | 93.4 | 81.6 | 96.8 | 95.9 | 90.7 | 95.3 | 97.8 |
| 110 | 5132 | 95.6 | 0.5 | 0.8 | 96.4 | 95 | 97.6 | 97.3 | 96.5 | 96.7 | 98 | 97.2 | 93.4 | 81.4 | 96.7 | 95.9 | 90.7 | 95.2 | 97.8 |
| 115 | 5114 | 102.6 | 0.5 | 0.8 | 96.5 | 95 | 97.7 | 97.2 | 96.5 | 96.7 | 98 | 97.3 | 93.5 | 81.8 | 96.9 | 95.9 | 90.9 | 95.3 | 97.8 |
| 120 | 5110 | 110.6 | 0.5 | 0.7 | 96.5 | 95.1 | 97.8 | 97.2 | 96.5 | 96.8 | 98 | 97.3 | 93.6 | 82 | 97 | 95.9 | 91 | 95.4 | 97.7 |
| 123 | 5107 | 114.2 | 0.5 | 0.8 | 96.5 | 95.1 | 97.8 | 97.1 | 96.6 | 96.8 | 98.1 | 97.4 | 93.6 | 82.1 | 97.1 | 95.9 | 91.1 | 95.4 | 97.7 |
| 125 | 5105 | 116.3 | 0.5 | 0.9 | 96.6 | 95.1 | 97.8 | 97.1 | 96.6 | 96.8 | 98.1 | 97.4 | 93.6 | 82.1 | 97.1 | 95.9 | 91.1 | 95.4 | 97.7 |
| 127 | 5103 | 118.8 | 0.5 | 1 | 96.5 | 95.1 | 97.8 | 97.1 | 96.5 | 96.8 | 98.1 | 97.4 | 93.6 | 82.1 | 97.1 | 95.9 | 91.1 | 95.4 | 97.7 |
| 130 | 5101 | 123 | 0.5 | 1 | 96.6 | 95.1 | 97.8 | 97.1 | 96.5 | 96.8 | 98.1 | 97.4 | 93.6 | 82.2 | 97.1 | 95.9 | 91.2 | 95.4 | 97.7 |
| 135 | 5101 | 129 | 0.5 | 1.1 | 96.6 | 95.1 | 97.8 | 97.1 | 96.5 | 96.8 | 98.1 | 97.4 | 93.6 | 82.2 | 97.2 | 95.8 | 91.2 | 95.4 | 97.7 |

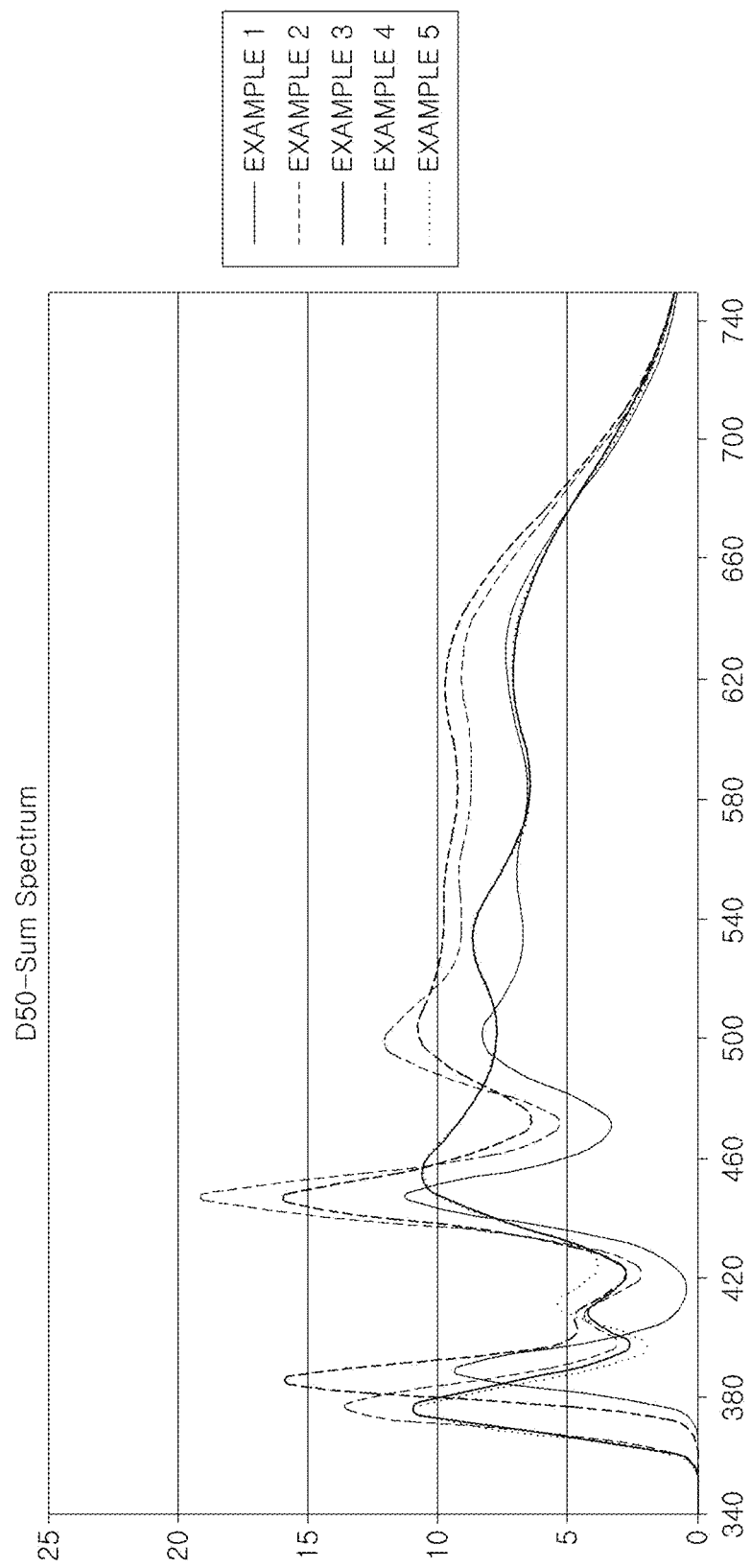

HIGH COLOR RENDERING D50/D65 STANDARD LED ILLUMINANT MODULE AND LIGHTING APPARATUS

CROSS-REFERENCE TO RELATED APPLICATIONS

This application is a Continuation of patent application Ser. No. 16/643,434, filed on 28 Feb. 2020, which is the U.S. National Stage for International Patent Cooperation Treaty Application PCT/KR2018/010336 filed 5 Sep. 2018, which claims priority from Korean Patent Application No. 10-2017-0113643, filed on 6 Sep. 2017, in the Korean Intellectual Property Office; and Korean Patent Application No. 10-2018-0105482, filed on 4 Sep. 2018, in the Korean Intellectual Property Office. The entire contents of said applications are incorporated herein by reference for all purposes.

BACKGROUND

Technical Field

The present invention relates to an LED illuminant module and lighting apparatus and, more specifically, to a high color rendering D50/D65 standard LED illuminant module and a lighting apparatus, which have high color rendering properties and excellent metamerism index characteristics by using a high color rendering LED and an ultraviolet LED.

Background Art

Many people often experience that the color of the clothes they saw at a clothing store looks different when they see the clothes later. This phenomenon occurs because a color of an object perceived by people varies depending on the lighting.

Therefore, in a case in which it is necessary to accurately inspect colors of woven fabrics, printed matters, or the like, the color needs to be determined under an environment in which inspection lamps, which conform to the predetermined standard lighting specifications, are used, as can be seen in FIG. 1. In this case, in order to satisfy the standard lighting specifications, a color rendering index (CRI) at various wavelengths needs to be a predetermined reference value or higher (e.g., an average color rendering index (Ra) of R1 to R15 is 90 or higher), and a metamerism index (MI), which indicates how differently colors are perceived depending on the lighting), also needs to have a value equal to or smaller than a reference value.

More specifically, FIG. 2 illustrates the specifications for D65 (6,500K Daylight) and D50 (5,000K Daylight) standard illuminants according to the Japanese Industrial Standards (JIS). Reference values need to be satisfied so that a visible-range metamerism index (MIvis) is 1.0 or lower, a UV-range metamerism index (MIuv) is 1.5 or lower, an average color rendering index is 95% or higher, and a special color rendering indexes R9 to R15 are 85% or higher. In addition, according to the specifications of the International Standardization Organization (ISO), the respective reference values need to be satisfied so that the visible-range metamerism index (MIvis) is 1.0 or lower, the UV-range metamerism index (MIuv) is 1.5 or lower, the average color rendering index is 90% or higher, and each of the color rendering indexes including the special color rendering indexes R9 to R15 is 80% or higher.

In the related art, a mercury or fluorescent lamp has been generally used as a standard illuminant, but the use of the mercury or fluorescent lamp is increasingly restricted worldwide due to problems such as low energy efficiency as well as substances harmful to the environment.

While there have been various attempts made to implement a standard illuminant using a light-emitting diode (LED) or the like, it is difficult to implement a high color rendering index (CRI) at various wavelengths and it is more difficult to implement characteristics excellent in the visible-range metamerism index (MIvis) and the UV-range metamerism index (MIuv) because the light-emitting diode (LED) has the property of emitting light having a specific wavelength.

For this reason, despite efforts to implement the standard illuminant using the light-emitting diode (LED) or the like, the standard illuminant, which uses the light-emitting diode (LED) and has a performance sufficient for the standard illuminant, has not yet been implemented.

DISCLOSURE

Technical Problem

The present invention has been made in an effort to solve the above-mentioned problems in the related art, and an object of the present invention is to provide a high color rendering standard LED illuminant module and a lighting apparatus, which have high color rendering properties and excellent metamerism index characteristics by using a light-emitting diode (LED).

The detailed objects of the present invention will be apparently identified and understood by experts or researchers in this technical field through the specific description disclosed below.

Technical Solution

In order to achieve the above-mentioned object, an illuminant module according to an exemplary embodiment of the present invention includes: one or more ultraviolet light-emitting diode (LED) devices having a peak emission wavelength of 300 nm to 400 nm; and one or more first white light-emitting diode (LED) devices having an average color rendering index of 90% or higher, in which the first white light-emitting diode (LED) device is a light-emitting diode (LED) device including a first LED chip having an excitation wavelength of 440 nm to 460 nm, and a first phosphor layer configured to emit light by being excited at the excitation wavelength of the first LED chip, and the first phosphor layer includes a first phosphor having a peak emission wavelength of 440 nm to 499 nm, a second phosphor having a peak emission wavelength of 500 nm to 580 nm, and a third phosphor having a peak emission wavelength of 600 nm to 699 nm.

In this case, a numerical value of UV content of the illuminant module may be within a range from 60 to 160.

In addition, two or more types of light-emitting diode (LED) devices having different peak wavelengths may be used as the first white light-emitting diode (LED) devices.

In addition, the illuminant module may further include a light transmissive member configured to accommodate therein the ultraviolet light-emitting diode (LED) device and the first white light-emitting diode (LED) device, in which the light transmissive member is made of PMMA, glass, or a material that transmits an ultraviolet ray.

In addition, two or more types of light-emitting diode (LED) devices having different peak wavelengths may be used as the ultraviolet light-emitting diode (LED) devices.

In addition, the illuminant module may have a light emitting characteristic in which a visible-range metamerism index (MIvis) is 1.0 or lower and a UV-range metamerism index (MIuv) is 1.5 or lower by the ultraviolet light-emitting diode (LED) device and the first white light-emitting diode (LED) device.

In this case, the illuminant module may have a light emitting characteristic in which an average color rendering index (Ra) is 90% or higher and a special color rendering indexes (R9 to R15) is 80% or higher.

Further, a correlated color temperature CCT may be within a range from 2,000K to 10,000K.

Furthermore, the illuminant module may further include one or more second white light-emitting diode (LED) devices having an average color rendering index of 90% or higher, in which the second white light-emitting diode (LED) device is a light-emitting diode (LED) device including a second LED chip having an excitation wavelength of 400 nm to 440 nm and a second phosphor layer configured to emit light by being excited at the excitation wavelength of the second LED chip, and the second phosphor layer includes a first phosphor having a peak emission wavelength of 440 nm to 499 nm, a second phosphor having a peak emission wavelength of 500 nm to 580 nm, and a third phosphor having a peak emission wavelength of 600 nm to 699 nm.

In this case, two or more types of light-emitting diode (LED) devices having different peak wavelengths may be used as the first white light-emitting diode (LED) device and the second white light-emitting diode (LED) device.

In addition, the illuminant module may further include one or more blue light-emitting diode (LED) devices having a peak emission wavelength of 400 nm to 470 nm.

In this case, peak wavelength spectrum intensity of the ultraviolet light-emitting diode (LED) device at a wavelength of 300 nm to 400 nm may be within a range of 60% to 90% of peak wavelength spectrum intensity of the blue light-emitting diode (LED) device at a wavelength of 400 nm to 470 nm.

In addition, in the first white light-emitting diode (LED) device, the first LED chip may have an excitation wavelength of 400 nm to 440 nm.

An illuminant module according to another exemplary embodiment of the present invention includes: one or more ultraviolet light-emitting diode (LED) devices having a peak emission wavelength of 300 nm to 400 nm; and one or more second white light-emitting diode (LED) devices having an average color rendering index of 90% or higher, in which the second white light-emitting diode (LED) device is a light-emitting diode (LED) device including a second LED chip having an excitation wavelength of 400 nm to 440 nm, and a second phosphor layer configured to emit light by being excited at the excitation wavelength of the second LED chip, and the second phosphor layer includes a first phosphor having a peak emission wavelength of 440 nm to 499 nm, a second phosphor having a peak emission wavelength of 500 nm to 580 nm, and a third phosphor having a peak emission wavelength of 600 nm to 699 nm.

In this case, a numerical value of UV content of the illuminant module may be within a range from 60 to 160.

In addition, two or more types of light-emitting diode (LED) devices having different peak wavelengths may be used as the second white light-emitting diode (LED) devices.

In addition, two or more types of light-emitting diode (LED) devices having different peak wavelengths may be used as the ultraviolet light-emitting diode (LED) devices.

Further, the illuminant module may further include one or more blue light-emitting diode (LED) devices having a peak emission wavelength of 400 nm to 470 nm.

In this case, peak wavelength spectrum intensity of the ultraviolet light-emitting diode (LED) device at a wavelength of 300 nm to 400 nm may be within a range of 60% to 90% of peak wavelength spectrum intensity of the blue light-emitting diode (LED) device at a wavelength of 400 nm to 470 nm.

Another aspect of the present invention provides a lighting apparatus including the above-mentioned illuminant module.

Advantageous Effects

According to the present invention, the illuminant module is configured by using the ultraviolet light-emitting diode (LED) device having the peak emission wavelength of 300 nm to 400 nm and the one or more first white light-emitting diode devices having the average color rendering index of 90% or higher and including the first LED chip having the excitation wavelength of 440 nm to 460 nm and the first phosphor layer configured to emit light at the excitation wavelength of the first LED chip, thereby providing the high color rendering standard LED illuminant module and the lighting apparatus which have high color rendering properties and excellent metamerism index characteristics. The white LED chip according to the present invention has high color rendering properties in respect to special colors such as, particularly, R9 and R12.

In addition, according to the present invention, the illuminant module further includes the one or more second white light-emitting diode (LED) devices having the average color rendering index of 90% or higher and including the second LED chip having the excitation wavelength of 400 nm to 440 nm and the second phosphor layer configured to emit light at the excitation wavelength of the second LED chip, or the illuminant module is configured such that the first LED chip has the excitation wavelength of 400 nm to 440 nm, such that the illuminant module may have improved metamerism index characteristics.

In addition, according to the present invention, the illuminant module is configured to further include the blue light-emitting diode (LED) device having the peak emission wavelength of 400 nm to 470 nm, such that the illuminant module may have improved metamerism index characteristics.

BRIEF DESCRIPTION OF THE DRAWINGS

FIG. 2 is a view exemplarily illustrating specifications of the typical standard lighting.

FIGS. 6A, 6B, 7A, 7B, 8A, 8B, 9A and 9B are views illustrating experimental performance values and light emitting spectra for respective items in the illuminant module 10 that conforms to the specifications of the illuminant D65 according to the exemplary embodiment of the present invention.

Figure 10B:
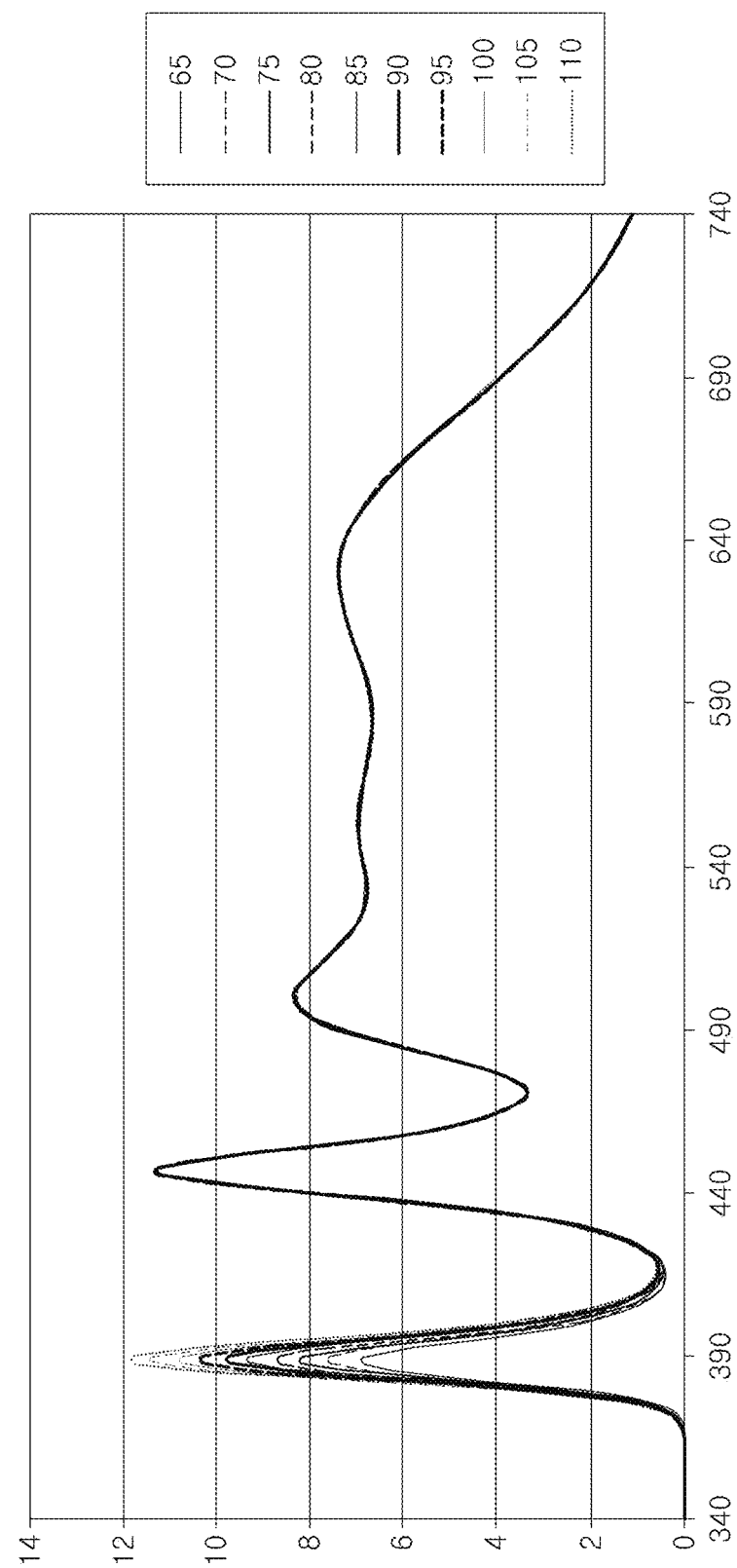

FIGS. 10A and 10B are views illustrating experimental performance values and light emitting spectra for respective items in the illuminant module 10 that conforms to the specifications of the illuminant D50 according to the exemplary embodiment of the present invention.

Figure 11A:
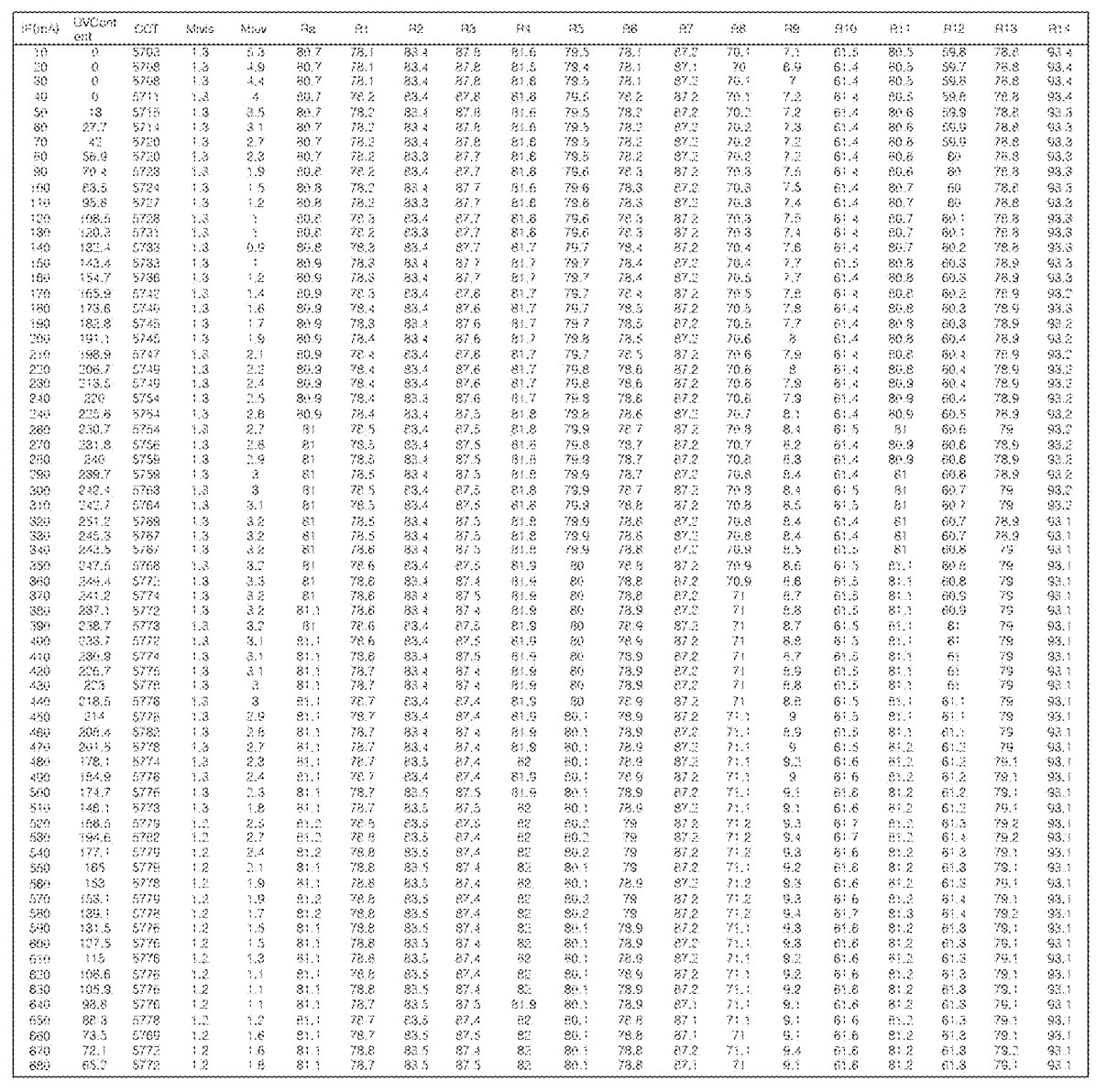
Figure 11B:
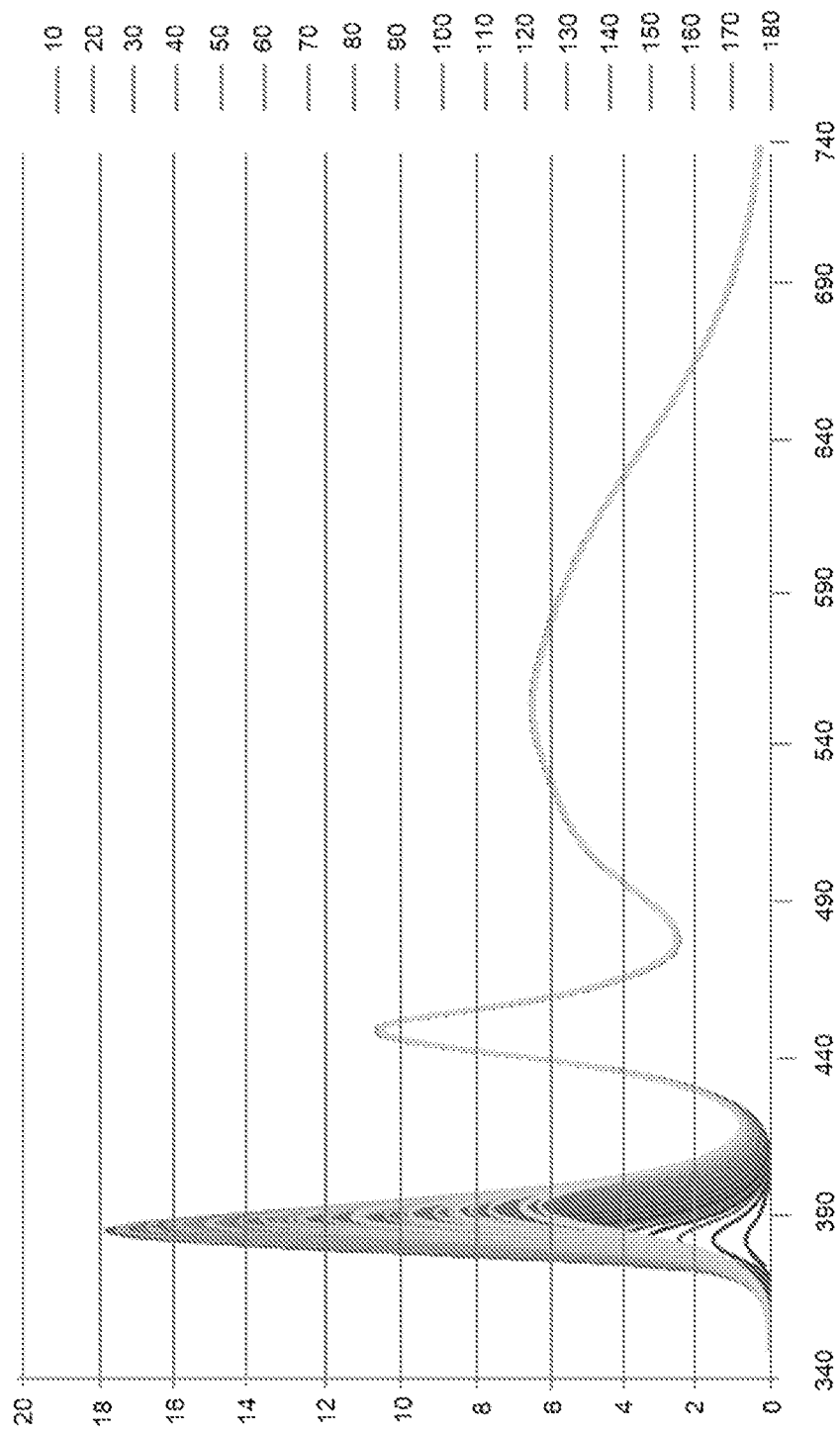

FIGS. 11A and 11B are views illustrating experimental performance values and light emitting spectra for respective items in an illuminant module using a light-emitting diode (Ra=80) having typical ductility as a comparative example with respect to the present invention.

Figure 12:
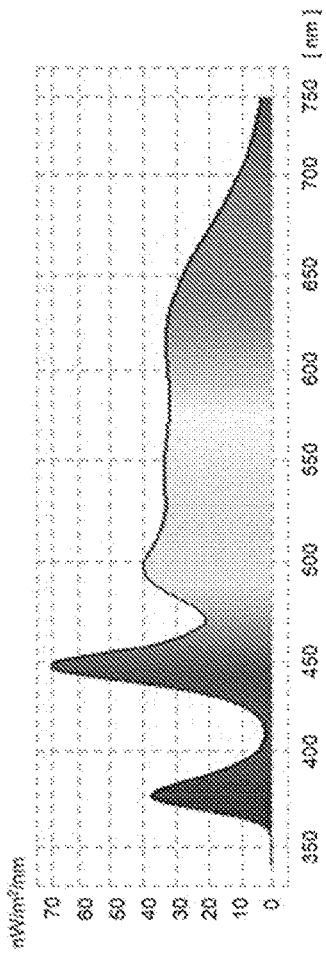
Figure 13:
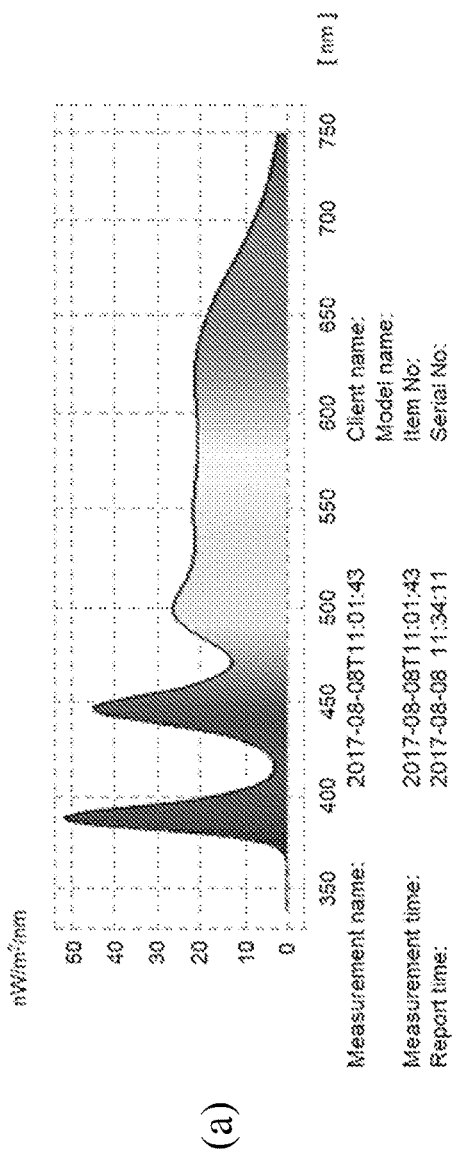

FIGS. 12 and 13 are views illustrating performance values measured by an integrating sphere in respect to the illuminant module 10 according to the exemplary embodiment of the present invention.

FIG. 14 is a table illustrating experimental performance results for respective items according to the specifications of the illuminant D65 of the illuminant module 10 according to various exemplary embodiments of the present invention.

FIGS. 15A to 15D are views illustrating measured performance values for respective items according to the specifications of the illuminant D65 of the illuminant module 10 according to various exemplary embodiments of the present invention.

FIG. 16 is a table illustrating experimental performance results for respective items according to the specifications of the illuminant D50 of the illuminant module 10 according to various exemplary embodiments of the present invention.

FIGS. 17A to 17D are views illustrating measured performance values for respective items according to the specifications of the illuminant D50 of the illuminant module 10 according to various exemplary embodiments of the present invention.

Figure 18A:

FIGS. 18A and 18B are views illustrating light emitting spectra according to the specifications of the illuminants D65 and D50 of the illuminant module 10 according to various exemplary embodiments of the present invention.

DETAILED DESCRIPTION

Best Mode

In order to describe the present invention, the operational advantages of the present invention, and the object achieved by carrying out the present invention, exemplary embodiments of the present invention will be described.

In the description of the present invention, the specific descriptions of publicly known related configurations or functions will be omitted when it is determined that the specific descriptions may obscure the subject matter of the present invention.

Hereinafter, exemplary embodiments of a high color rendering standard LED illuminant module and a lighting apparatus according to the present invention will be described in detail with reference to the accompanying drawings.

Figure 3:
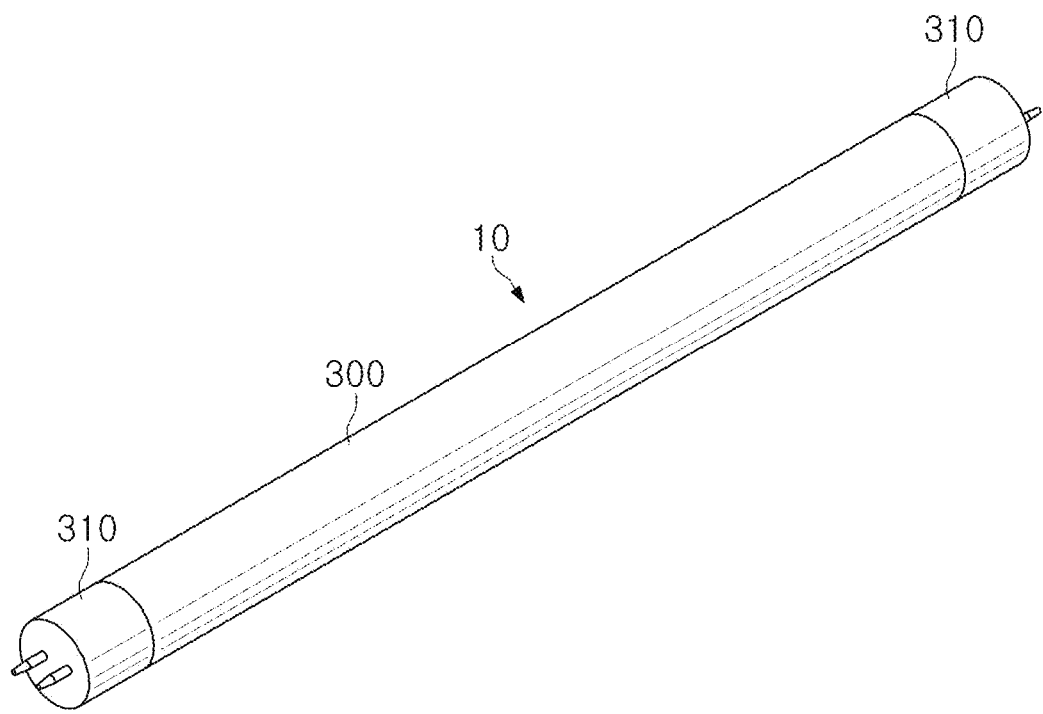
FIG. 3 is a perspective view of an illuminant module 10 according to an exemplary embodiment of the present invention.
Figure 4:
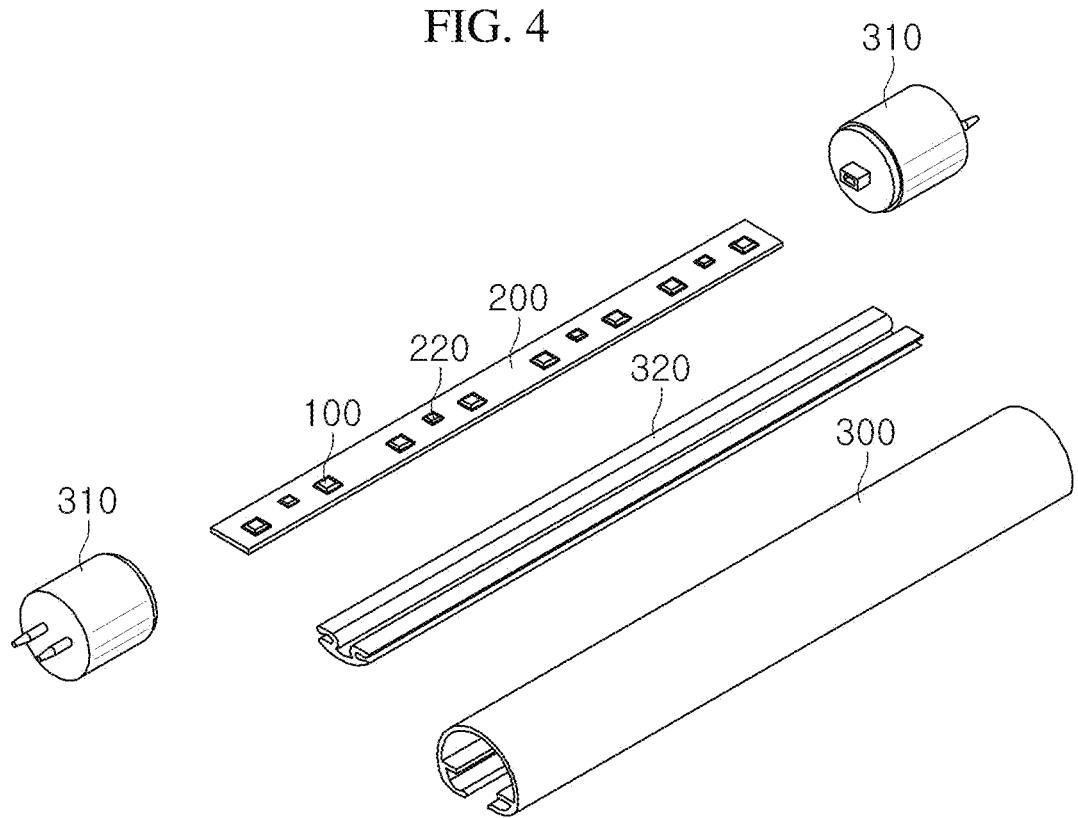
FIG. 4 is an exploded view of the illuminant module 10 according to the exemplary embodiment of the present invention.

FIG. 3 is a perspective view exemplarily illustrating an illuminant module 10 according to an exemplary embodiment of the present invention, and FIG. 4 is an exploded view exemplarily illustrating the illuminant module 10 according to the exemplary embodiment of the present invention.

As can be seen from FIGS. 3 and 4, the illuminant module 10 according to the exemplary embodiment of the present invention may include one or more ultraviolet light-emitting diode devices 220 and one or more first white light-emitting diode devices 100.

In this case, the ultraviolet light-emitting diode device 200 may be a light-emitting diode (LED) having a peak emission wavelength of 300 nm to 400 nm, and the first white light-emitting diode device 100 may be a light-emitting diode (LED) having an average color rendering index (Ra) of 90% or higher.

More specifically, the first white light-emitting diode device 100 is a light-emitting diode (LED) device including a first LED chip 130 having an excitation wavelength of 440 nm to 460 nm, and a first phosphor layer 150 configured to cover a light emitting surface of the first LED chip 130 and emit light by being excited at the excitation wavelength of the first LED chip 130. In this case, the first phosphor layer 150 may include a first phosphor 152 having a peak emission wavelength of 440 nm to 499 nm, a second phosphor 153 having a peak emission wavelength of 500 nm to 580 nm, and a third phosphor 154 having a peak emission wavelength of 600 nm to 699 nm.

Further, the illuminant module 10 according to the exemplary embodiment of the present invention may include a board 200 on which the ultraviolet light-emitting diode 220 and the first white light-emitting diode 100 are mounted, a support unit 320 on which the board 200 is seated, a light transmissive member 300 configured to accommodate therein the ultraviolet light-emitting diode 220 and the first white light-emitting diode 100 and transmit the light emitted from the ultraviolet light-emitting diode 220 and the first white light-emitting diode 100, and connecting units 310 electrically connected to the board 200 and configured to supply external power.

Hereinafter, the respective constituent elements of the illuminant module 10 according to the exemplary embodiment of the present invention will be described in detail.

Figure 5:
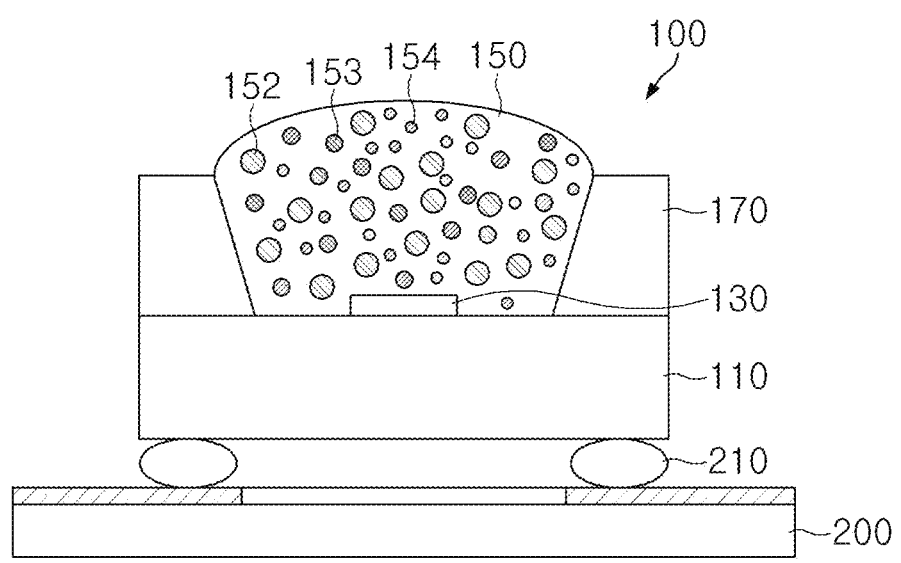
FIG. 5 is a cross-sectional view of a first white light-emitting diode 100 used for the illuminant module 10 according to the exemplary embodiment of the present invention.

First, FIG. 5 exemplarily illustrates the first white light-emitting diode device 100 according to the exemplary embodiment of the present invention.

Referring to FIG. 5, the first white light-emitting diode device 100 includes the first LED chip 130 mounted on the base board 110. The first white light-emitting diode device 100 may be joined by ball grids 210 by a surface mount technology (SMT) and mounted on various types of boards 200 such as a metal board (metal PCB). Of course, the package structure illustrated in FIG. 5 is an example in which the LED device according to the present invention is applied, and the package structure may also be implemented by other packaging methods.

A frame 170 having a predetermined shape, e.g., a cylindrical shape is installed on the base board 110 of the first white light-emitting diode device 100, and a reflector configured to efficiently reflect the light emitted from the first LED chip 130 is installed on an inner surface of the frame 170. Although not illustrated, one electrode of the first LED chip 130 may be electrically connected to the frame 170 through a bonding wire. In addition, the other electrode of the first LED chip 130 may be electrically connected to a metal wire on the base board.

The first LED chip 130 includes a light-emitting diode having a peak wavelength of 440 nm to 460 nm. The InGaN-based light-emitting diode or the GaN-based light-emitting diode may be used as the light-emitting diode. In the present invention, other types of light emitting devices such as laser diodes may be used instead of the first LED chip 130.

The first LED chip 130 is surrounded by the first phosphor layer 150. The first phosphor layer 150 includes phosphors 152, 153, and 154 that emit light having a predetermined wavelength by being excited at the light emitting wavelength of the first LED chip 130. In the present invention, the phosphor is particularly provided in the form of powder. To this end, the first phosphor layer 150 may include transparent resin that disperses and fixes the phosphors and seals the first LED chip 130.

In the present invention, typical silicone or epoxy resin may be used as the transparent resin.

In the present invention, the phosphors 152, 153, and 154 are made of fluorescent materials having different compositions. Particularly, the phosphors include at least three types of fluorescent materials having different light emitting wavelengths. In the present invention, the phosphors 152, 153, and 154 include a first phosphor B configured to emit blue light by being excited by the light emitted from the first LED chip 130, a second phosphor G configured to emit green light, and a third phosphor R configured to emit red light. In the present invention, the first, second, and third phosphors may be oxides or nitrides.

In the present invention, the first phosphor 152 is excited by the light emitted from the first LED chip 100 and emits light having a peak wavelength of 440 nm to 499 nm. The peak emission wavelength of the first phosphor 152 is larger than the peak wavelength of the light emitted from the first LED chip 130.

In the present invention, a phosphor, which is expressed by the following Chemical Formula 1 and emits blue light, may be used as the first phosphor 152.

(Ba,Eu)SiO$_x$(O,Cl)$_x$N$_x$(1<x<5)   (Chemical Formula 1)

In the present invention, the second phosphor 153 is excited by the light emitted from the first LED chip 130 and emits light having a peak wavelength of 500 nm to 580 nm. Phosphors, which are expressed by the following Chemical Formulas 2 to 4 and emit green light, may be used alone or in combination as the second phosphor 153.

(Sr,Ba,Ca)$_x$SiO$_{2x}$:Eu(1<x<5)   (Chemical Formula 2)

Si$_{6-y}$Al$_y$O$_y$N$_{8-y}$:Eu(0.1<y<0.5)   (Chemical Formula 3)

Al$_{8-z}$Lu$_z$O$_{12}$:Ce++(1<z<5)   (Chemical Formula 4)

In the present invention, the third phosphor 154 is excited by the light emitted from the first LED chip 130 and emits light having a peak wavelength of 600 nm to 699 nm. Phosphors, which are expressed by the following Chemical Formulas 5 and 6, may be used alone or in combination as the third phosphor 154.

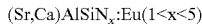

(Sr,Ca)AlSiN$_x$:Eu(1<x<5)

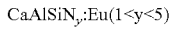

CaAlSiN$_y$:Eu(1<y<5)

Further, two or more types of light-emitting diode (LED) devices having different peak wavelengths may be used as the first white light-emitting diode devices 100, thereby improving characteristics, such as the metamerism index, of the illuminant module 10.

Next, the ultraviolet light-emitting diode 220 may include one or more light-emitting diodes having a peak emission wavelength of 300 nm to 400 nm.

In this case, the amount of light emitted from the ultraviolet light-emitting diode 220 and having a wavelength of 300 nm to 400 nm may be within a range from 20% to 80% of the total amount of light emitted from the illuminant module 10. Further, a correlated color temperature CCT of the illuminant module 10 may be within a range from 2,000K to 10,000K.

In addition, the required standard lighting specifications (e.g., the visible-range metamerism index (MIvis), the UV-range metamerism index (MIuv), the average color rendering index (Ra), and the special color rendering indexes (R9 to R15)) of the illuminant module 10 may be greatly improved by adjusting a numerical value of UV content, which corresponds to the ultraviolet content of the light emitted from the illuminant module 10, so that the numerical value of UV content is within a range from 60 to 160. This will be described below in more detail with reference to experimental results in respect to the exemplary embodiments.

In addition, the same type of light-emitting diode (LED) does not necessarily have to be used as the ultraviolet light-emitting diode (LED) device, and two or more types of light-emitting diode (LED) devices having different peak wavelengths may be used. In particular, since the two or more types of ultraviolet light-emitting diode (LED) devices having different peak wavelengths are used together, the visible-range metamerism index (MIvis) and the UV-range metamerism index (MIuv) may be greatly improved. This will be described below in more detail with reference to experimental results in respect to the exemplary embodiments.

Further, in the present invention, the ultraviolet light-emitting diode device 220 may have a package structure in which the ultraviolet LED chip is mounted on the base board 110, but the present invention is not necessarily limited thereto. Various structures such as a structure in which the ultraviolet LED chip is mounted directly on the board 200 and emits ultraviolet rays may be applied.

More specifically, in the case of the illuminant module 10 according to the exemplary embodiment of the present invention, the illuminant is configured by using the one or more ultraviolet light-emitting diode devices 220 having a peak emission wavelength of 300 nm to 400 nm and the one or more first white light-emitting diode (LED) devices having an average color rendering index (Ra) of 90% or higher. As a result, it is possible to achieve the high color rendering index (CRI) and the excellent metamerism index (MI) which are required for the standard illuminant but were hardly implemented by the light-emitting diode (LED) in the related art.

That is, as can be seen in FIG. 2, according to the specifications of the D65 (6,500K Daylight) standard illuminant according to the Japanese Industrial Standard (JIS), the reference values need to be satisfied so that the visible-range metamerism index (MIvis) is 1.0 or lower, the UV-range metamerism index (MIuv) is 1.5 or lower, the average color rendering index is 95% or higher, and the special color rendering indexes R9 to R15 are 85% or higher (in the case of the specifications according to the International Standardization Organization (ISO), the average color rendering index is 90% or higher and each of the color rendering indexes including the special color rendering indexes R9 to R15 is 80% or higher). However, the average color rendering index is implemented to be about 75% to 80% by the typical light-emitting diode (LED) in the related art, and the special color rendering index significantly deteriorates at a particular wavelength. Further, it is even more difficult to implement excellent characteristics such as the visible-range metamerism index (MIvis) and the UV-range metamerism index (MIuv).

In contrast, in the case of the illuminant module 10 according to the exemplary embodiment of the present invention, the illuminant is configured by using the one or more ultraviolet light-emitting diode devices 220 having the peak emission wavelength of 300 nm to 400 nm and the one or more first white light-emitting diode (LED) devices having the average color rendering index (Ra) of 90% or higher. As a result, the respective reference values may be satisfied so that the visible-range metamerism index (MIvis) is 1.0 or lower, the UV-range metamerism index (MIuv) is 1.5 or lower, the average color rendering index (Ra) is 90% or higher, and each of the color rendering indexes including the special color rendering indexes R9 to R15 is 80% or higher.

Further, the board 200 may be provided with a pad on which the first white light-emitting diode 100 and the ultraviolet light-emitting diode 220 are mounted, and a circuit pattern configured to operate the first white light-emitting diode 100 and the ultraviolet light-emitting diode 220. The board 200 may be made of a dielectric material such as FR-4. Further, the board 200 may be made of various materials and configured as a metal board (metal PCB) in order to facilitate the dissipation of heat from the first white light-emitting diode 100 and the ultraviolet light-emitting diode 220. In this case, the board 200 may be electrically connected to the connecting units 310 and supplied with external power.

Further, the illuminant module 10 according to the exemplary embodiment of the present invention may be provided with the support unit 320 on which the board 200 is seated. Further, in order to facilitate the dissipation of heat from the board 200, the support unit 320 may be made of metal or may have a structure advantageous to the dissipation of heat.

In addition, the illuminant module 10 according to the exemplary embodiment of the present invention may be provided with the light transmissive member 300 that accommodates therein the ultraviolet light-emitting diode 220 and the first white light-emitting diode 100 and transmits the light emitted from the ultraviolet light-emitting diode 220 and the first white light-emitting diode 100. The light transmissive member 300 may be made of PMMA, glass, or the like that may effectively transmit the ultraviolet light emitted from the ultraviolet light-emitting diode 220 and the light emitted from the first white light-emitting diode 100. Further, the light transmissive member 300 may be made of a semi-transparent material in order to reduce light blindness.

Figure 6B:
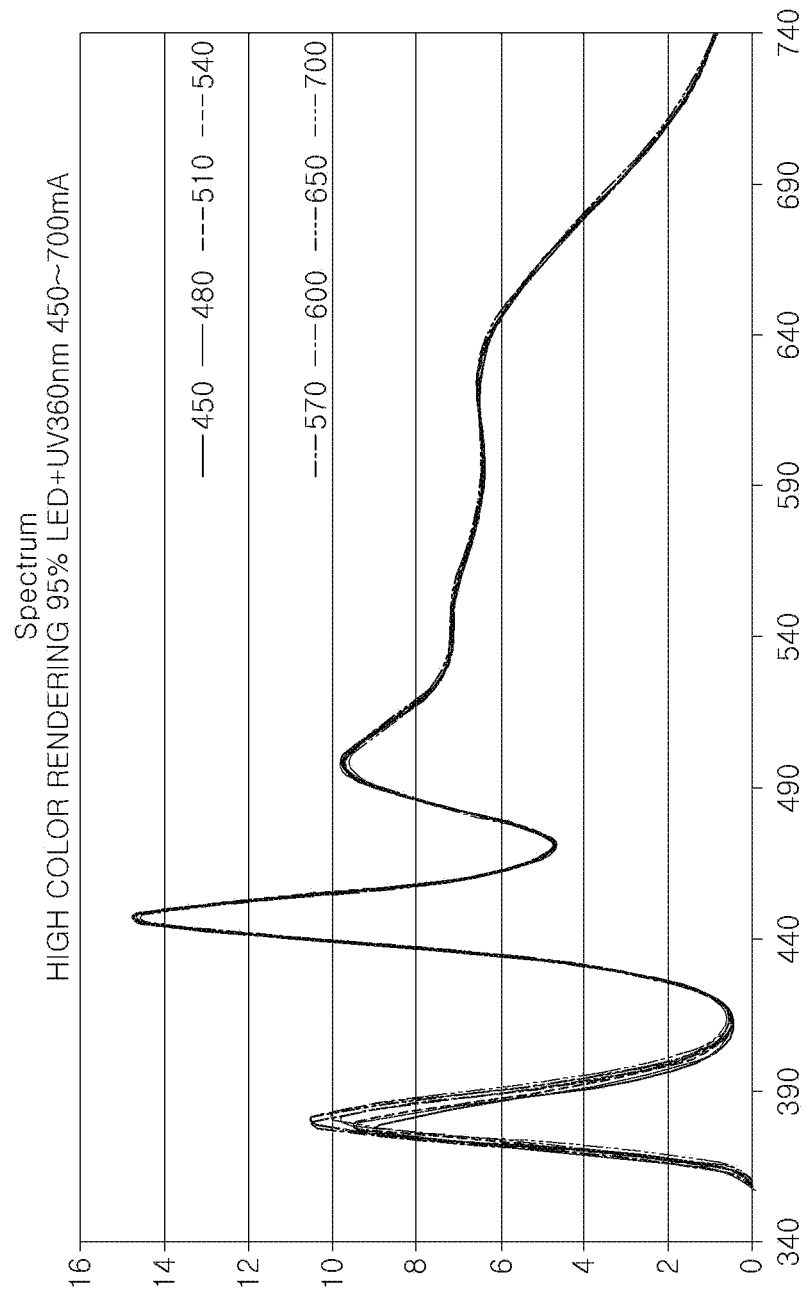
Figure 7B:
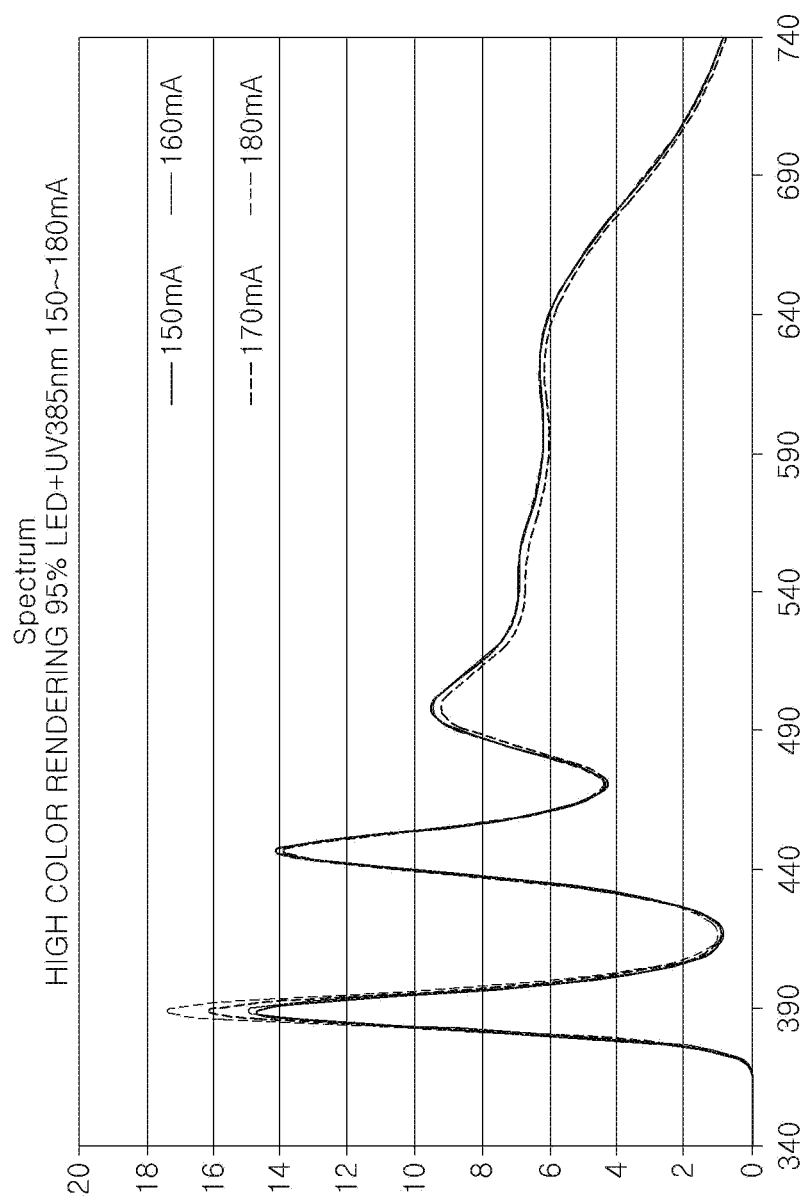
Figure 8B:
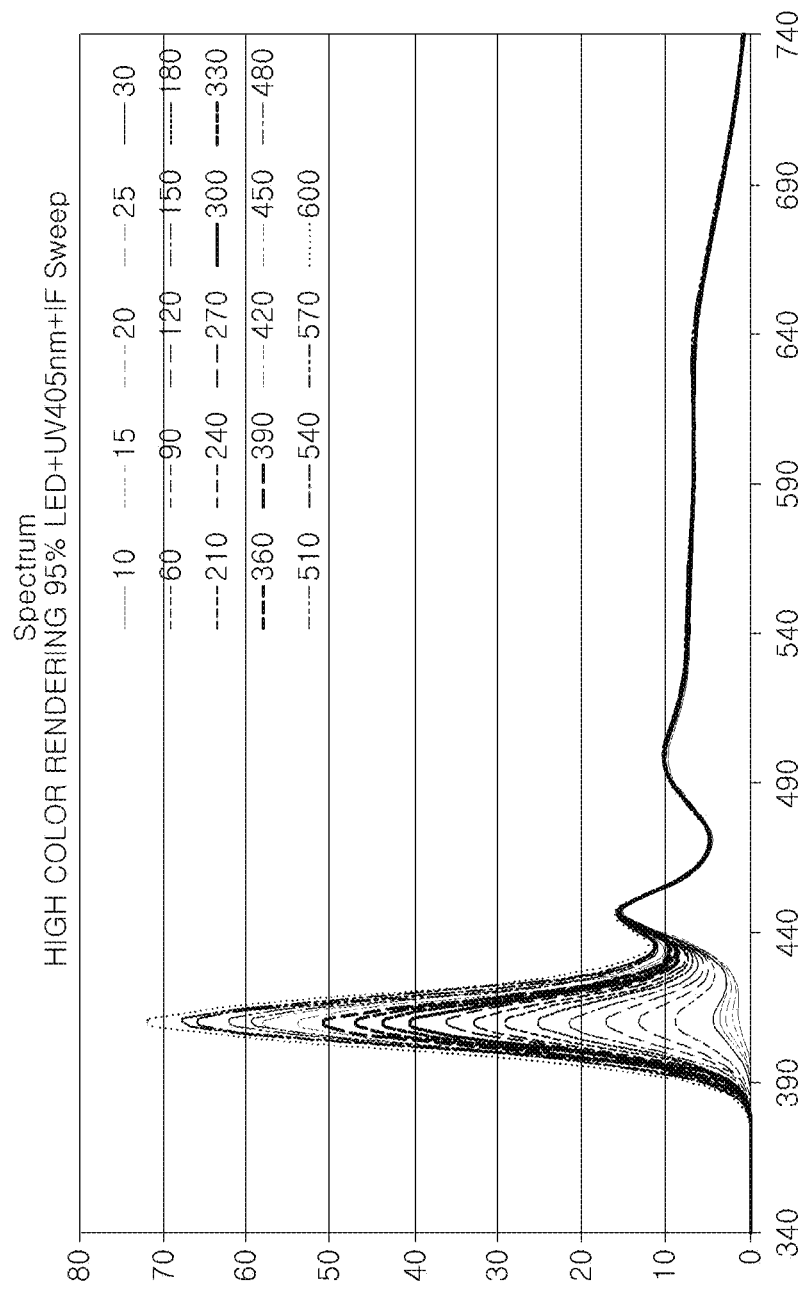
Figure 9B:
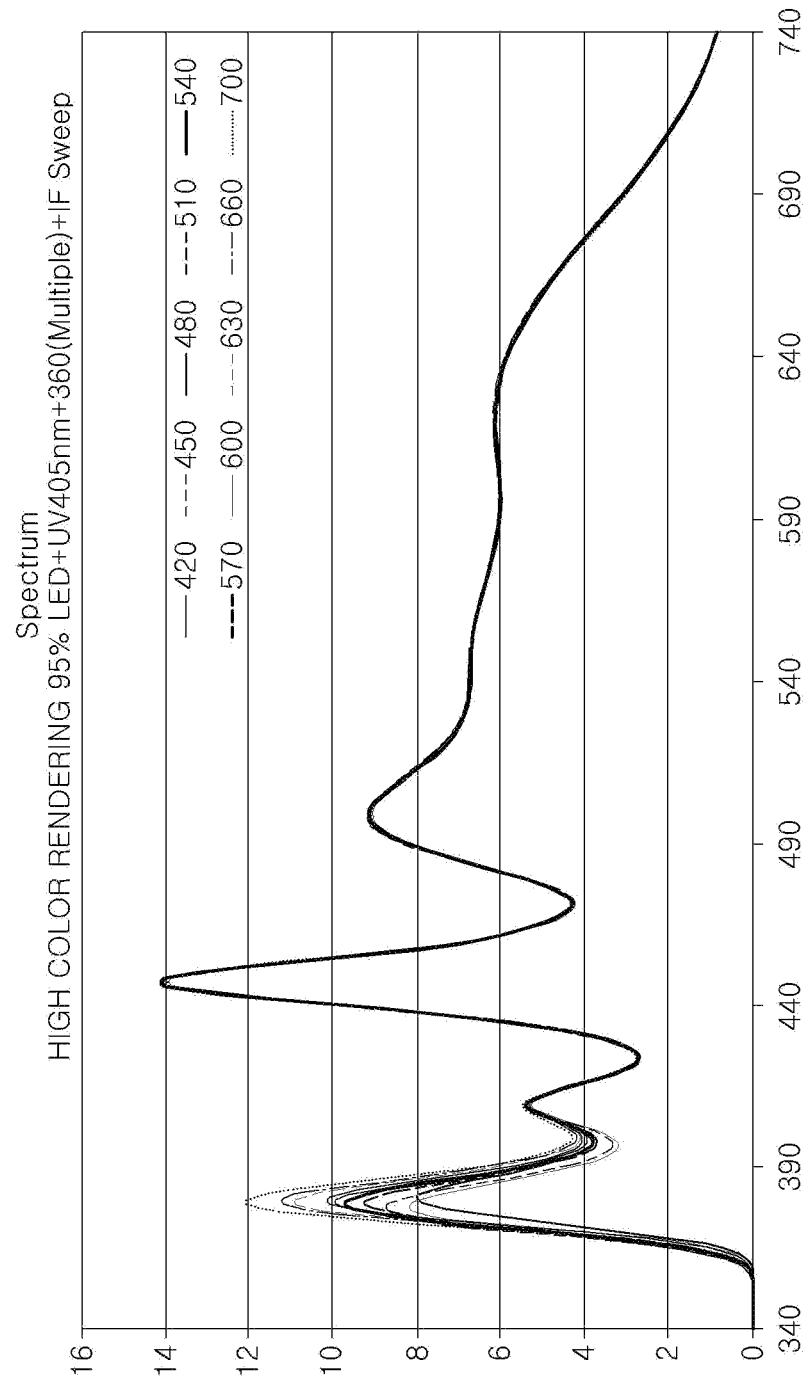

Hereinafter, the present invention will be described in more detail with reference to FIGS. 6A/B to 9A/B based on experimental values of the illuminant module 10 that conforms to the specifications of the illuminant D65 (6,500K) according to the exemplary embodiment of the present invention.

First, FIGS. 6A, 7A, 8A and 9A illustrate experimental performance values for respective items in the illuminant module 10 according to the exemplary embodiment of the present invention. More specifically, FIGS. 6A, 7A, 8A and 9A sequentially illustrate experimental values when the illuminant module 10 is configured by using the first white light-emitting diode device 100 having the average color rendering index of 90% or higher, the ultraviolet light-emitting diode devices 220 having peak wavelengths of 360 nm, 385 nm, and 405 nm, and the two ultraviolet light-emitting diode devices 220 having peak wavelengths of 360 nm and 405 nm.

Further, FIGS. 6B, 7B, 8B and 9B illustrate light emitting spectra of the illuminant module 10 according to the exemplary embodiment of the present invention.

Hereinafter, in the present invention, the measured data including the correlated color temperature CCT, the UV content, the visible-range metamerism index (MIvis), the UV-range metamerism index (MIuv), the average color rendering index (Ra), and the special color rendering indexes (R9 to R15) in respect to respective examples and comparative examples are calculated by using SPECTIS 1.0 Touch equipment of GL OPTIC.

First, it can be seen that in the case illustrated in FIG. 6A (the ultraviolet light-emitting diode device 220 having a wavelength of 360 nm is used), the numerical value of the UV content is gradually increased as an input electric current (IF) is increased, and the reference values of the standard illuminant may be satisfied as the UV-range metamerism index (MIuv) is gradually decreased (6.0→1.5).

More specifically, as can be seen in FIG. 6A, it can be ascertained that the numerical value of the UV content becomes 60 or more when the input electric current (IF) is within a range from 450 mA to 700 mA, such that the illuminant module 10 according to the present invention satisfies all the specifications in respect to the visible-range metamerism index (MIvis), the UV-range metamerism index (MIuv), the average color rendering index (Ra), and the special color rendering indexes (R9 to R15).

Further, FIG. 7A illustrates that in the case in which the ultraviolet light-emitting diode device 220 having a wavelength of 385 nm is used, the numerical value of the UV content is gradually increased as the input electric current (IF) is increased, and the reference values of the standard illuminant may be satisfied as the UV-range metamerism index (MIuv) is gradually decreased (5.9→1.5).

More specifically, as can be seen in FIG. 7A, the numerical value of the UV content is within a range from 60 to 120 when the input electric current (IF) is within a range from 150 mA to 180 mA, such that the illuminant module 10 according to the present invention satisfies all the specifications in respect to the visible-range metamerism index (MIvis), the UV-range metamerism index (MIuv), the average color rendering index (Ra), and the special color rendering indexes (R9 to R15).

In addition, in the case in which the ultraviolet light-emitting diode device 220 having a wavelength of 405 nm is used as illustrated in FIG. 8A, even though the input electric current (IF) is increased, the numerical value of the UV content remains within a range below about 35, and the UV-range metamerism index (MIuv) has a value of 3.5 or more, such that the reference values of the standard illuminant cannot be satisfied.

However, even in this case, as can be seen in FIG. 9A, the illuminant module 10 is configured by using the ultraviolet light-emitting diode device 220 having the wavelength of 405 nm and the ultraviolet light-emitting diode device 220 having the wavelength of 360 nm, such that all the specifications in respect to the visible-range metamerism index (MIvis), the UV-range metamerism index (MIuv), the average color rendering index (Ra), and the special color rendering indexes (R9 to R15) may be satisfied, and more excellent characteristics may be implemented.

That is, as can be seen in FIG. 9A, it can be ascertained that in the case in which the ultraviolet light-emitting diode device 220 having the wavelength of 405 nm and the ultraviolet light-emitting diode device 220 having the wavelength of 360 nm are used together and the input electric current of the ultraviolet light-emitting diode device 220 having the wavelength of 360 nm is increased to 420 mA or higher, the numerical value of the UV content becomes 60 or more, such that the illuminant module 10 according to the present invention satisfies all the specifications in respect to the visible-range metamerism index (MIvis), the UV-range metamerism index (MIuv), the average color rendering index (Ra), and the special color rendering indexes (R9 to R15), the visible-range metamerism index (MIvis) may be decreased to 0.4, and the UV-range metamerism index (MIuv) may be decreased to 1.2, thereby implementing very excellent metamerism index characteristics.

Next, FIG. 10A illustrates experimental performance values for respective items in the illuminant module 10 according to the specifications of the illuminant D50 (5,000K) according to the exemplary embodiment of the present invention. More specifically, FIG. 10A illustrates experimental values when the illuminant module 10 is configured by using the first white light-emitting diode device 100 having the average color rendering index of 90% or higher and the ultraviolet light-emitting diode device 220 having the peak wavelength of 385 nm.

In addition, FIG. 10B illustrates light emitting spectra of the illuminant module 10 according to the exemplary embodiment of the present invention.

In this case, it can be seen that in the case illustrated in FIG. 10A (when the ultraviolet light-emitting diode device 220 having a wavelength of 385 nm is used), the numerical value of the UV content is gradually increased as the input electric current (IF) is increased, and the reference values of the standard illuminant may be satisfied as the UV-range metamerism index (MIuv) is gradually decreased (4.5→0.8).

More specifically, as can be seen in FIG. 10A, it can be ascertained that the numerical value of the UV content becomes 60 to 130 when the input electric current (IF) is within a range from 65 mA to 110 mA, such that the illuminant module 10 according to the present invention may satisfy all the specifications in respect to the visible-range metamerism index (MIvis), the UV-range metamerism index (MIuv), the average color rendering index (Ra), and the special color rendering indexes (R9 to R15).

Therefore, referring to the experimental values for the specifications of the illuminant D50 (5,000K), it can be ascertained that all the specifications in respect to the visible-range metamerism index (MIvis), the UV-range metamerism index (MIuv), the average color rendering index (Ra), and the special color rendering indexes (R9 to R15) may be satisfied as the illuminant module 10 is configured by combining the first white light-emitting diode device 100 having the average color rendering index of 90% or higher and the ultraviolet light-emitting diode device 220 of the wavelength of 300 nm to 400 nm, like the specifications for the illuminant D65 (6,500K).

In contrast, FIGS. 11A and 11B illustrate experimental performance values and light emitting spectra for respective items in the illuminant module 10 using a light-emitting diode (Ra=80) having typical ductility as a comparative example with respect to the present invention.

More specifically, FIG. 11A illustrates experimental values when the illuminant module 10 is configured by using a typical white light-emitting diode device having an average color rendering index of about 80% and the ultraviolet light-emitting diode device 220 having the peak wavelength of 365 nm.

In addition, FIG. 11B illustrates light emitting spectra of the illuminant module 10 according to the comparative example.

In this case, it can be seen that in the case illustrated in FIG. 11A (when the white light-emitting diode device having the average color rendering index of about 80% and the ultraviolet light-emitting diode device 220 having the wavelength of 365 nm are used), the reference value of the standard illuminant (MIvis is 1.0 or lower) cannot be satisfied because the visible-range metamerism index (MIvis) has a value of 1.2 or more even though the numerical value of the UV content is gradually increased as the input electric current (IF) is increased.

Further, FIGS. 12 and 13 illustrate performance values measured by an integrating sphere in respect to the illuminant module 10 according to the exemplary embodiment of the present invention.

First, FIG. 12 exemplarily illustrates result values obtained by measuring the performance by using the integrating sphere after the illuminant module 10 according to the exemplary embodiment of the present invention is configured by using the first white light-emitting diode device 100 having the average color rendering index of 90% or higher and the ultraviolet light-emitting diode device 220 having the peak wavelength of 365 nm.

As can be seen in FIG. 12, it can be ascertained that the visible-range metamerism index (MIvis) is 0.5, the UV-range metamerism index (MIuv) is 1.5, the average color rendering index (Ra) is 96.4%, and all the special color rendering indexes (R9 to R15) are 89.6% or higher, such that the illuminant module 10 according to the exemplary embodiment of the present invention may satisfy all the specifications in respect to the visible-range metamerism index (MIvis), the UV-range metamerism index (MIuv), the average color rendering index (Ra), and the special color rendering indexes (R9 to R15).

In addition, FIG. 13 exemplarily illustrates result values obtained by measuring the performance by using the integrating sphere after the illuminant module 10 according to the exemplary embodiment of the present invention is configured by using the first white light-emitting diode device 100 having the average color rendering index of 90% or higher and the ultraviolet light-emitting diode device 220 having the peak wavelength of 385 nm.

As can be seen in FIG. 13, it can be ascertained that the visible-range metamerism index (MIvis) is 0.5, the UV-range metamerism index (MIuv) is 1.5, the average color rendering index (Ra) is 95.9%, and all the special color rendering indexes (R9 to R15) are 88.6% or higher, such that the illuminant module 10 according to the exemplary embodiment of the present invention may satisfy all the specifications in respect to the visible-range metamerism index (MIvis), the UV-range metamerism index (MIuv), the average color rendering index (Ra), and the special color rendering indexes (R9 to R15).

Mode for Invention

Further, the illuminant module 10 according to the exemplary embodiment of the present invention may further include one or more blue light-emitting diode devices 102 having a peak emission wavelength of 400 nm to 470 nm in addition to the first white light-emitting diode 100 and the ultraviolet light-emitting diode 220.

In this case, a single-color light-emitting diode having a peak emission wavelength of 400 nm to 470 nm may be used as the blue light-emitting diode 102.

Therefore, in the present invention, the illuminant module 10 is configured by using the one or more blue light-emitting diode devices 102 having the peak emission wavelength of 400 nm to 470 nm in addition to the first white light-emitting diode 100 and the ultraviolet light-emitting diode 220, such that the illuminant module 10 may have improved metamerism index characteristics.

Further, peak wavelength spectrum intensity of the ultraviolet light-emitting diode device 220 at the wavelength of 300 nm to 400 nm may be within a range of 60% to 90% of peak wavelength spectrum intensity of the blue light-emitting diode device 102 at the wavelength of 400 nm to 470 nm.

More specifically, FIG. 14 exemplarily illustrates experimental performance results for respective items according to the specifications of the illuminant D65 of the illuminant module 10 according to the exemplary embodiment of the present invention. Referring to FIG. 14, when making a comparison between experimental performance results of Example 1 (the first white light-emitting diode 100 and the ultraviolet light-emitting diode 220) and Example 2 (the first white light-emitting diode 100, the ultraviolet light-emitting diode 220, and the blue light-emitting diode 102), it can be ascertained that in contrast to Example 1 in which the visible-range metamerism index (MIvis) is 0.7 and the UV-range metamerism index (MIuv) is 1.5, the performance value is greatly improved in Example 2 in which the visible-range metamerism index (MIvis) is 0.5 and the UV-range metamerism index (MIuv) is 0.8.

In addition, FIG. 15A exemplarily illustrates performance values measured for respective items according to the specifications of the illuminant D65 in respect to Example 2 (the first white light-emitting diode 100, the ultraviolet light-emitting diode 220, and the blue light-emitting diode 102).

As can be seen in FIG. 15A, it can be seen that as the input electric current (IF) is increased, the numerical value of the UV content is gradually increased, and the UV-range metamerism index (MIuv) is decreased, such that the UV-range metamerism index (MIuv) may be greatly decreased to 1.0 or lower when the input electric current (IF) is within a range from 190 mA to 250 mA.

Further, the illuminant module 10 according to the exemplary embodiment of the present invention may further include one or more second white light-emitting diode devices 101 having an average color rendering index of 90% or higher in addition to the first white light-emitting diode 100 and the ultraviolet light-emitting diode 220.

In this case, similar to the structure of the first white light-emitting diode 100 in FIG. 5, the second white light-emitting diode device 101 may be a light-emitting diode (LED) device including a second LED chip 140 having an excitation wavelength of 400 nm to 440 nm and a second phosphor layer 160 configured to emit light by being excited at the excitation wavelength of the second LED chip 140. Here, the second phosphor layer 160 may include a first phosphor 152 having a peak emission wavelength of 440 nm to 499 nm, a second phosphor 153 having a peak emission wavelength of 500 nm to 580 nm, and a third phosphor 154 having a peak emission wavelength of 600 nm to 699 nm.

In the exemplary embodiment of the present invention, the first phosphor 152, the second phosphor 153, and the third phosphor 154 included in the second phosphor layer 160 may be identical to the first phosphor 152, the second phosphor 153, and the third phosphor 154 included in the first phosphor layer 150, but the present invention is not necessarily limited thereto.

Further, two or more types of light-emitting diode (LED) devices having different peak wavelengths may be used as the first white light-emitting diode devices 100 and the second white light-emitting diode devices 101, thereby improving characteristics, such as the metamerism index, of the illuminant module 10.

Furthermore, in the exemplary embodiment of the present invention, the first white light-emitting diode 100 and the second white light-emitting diode 101 may be configured and used as separate devices, but the present invention is not necessarily limited thereto. The first white light-emitting diode 100 and the second white light-emitting diode 101 may be integrated and used as a single device.

Therefore, in the present invention, the illuminant module 10 is configured by using the one or more second white light-emitting diode devices 101 each having the average color rendering index of 90% or higher and including the second LED chip 140 having the excitation wavelength of 400 nm to 440 nm and the second phosphor layer 160 configured to emit light at the excitation wavelength of the second LED chip 140 in addition to the first white light-emitting diode 100 and the ultraviolet light-emitting diode 220, such that the illuminant module 10 may have improved metamerism index characteristics.

More specifically, referring back to FIG. 14, when making a comparison between experimental performance results of Example 1 (the first white light-emitting diode 100 and the ultraviolet light-emitting diode 220) and Example 3 (the first white light-emitting diode 100, the ultraviolet light-emitting diode 220, and the second white light-emitting diode 101), it can be ascertained that in contrast to Example 1 in which the visible-range metamerism index (MIvis) is 0.7 and the UV-range metamerism index (MIuv) is 1.5, the performance value is greatly improved in Example 3 in which the visible-range metamerism index (MIvis) is 0.6 and the UV-range metamerism index (MIuv) is 0.9.

In addition, FIG. 15B exemplarily illustrates performance values measured for respective items according to the specifications of the illuminant D65 in respect to Example 3 (the first white light-emitting diode 100, the ultraviolet light-emitting diode 220, and the second white light-emitting diode 101).

As can be seen in FIG. 15B, it can be seen that even in Example 3, as the input electric current (IF) is increased, the numerical value of the UV content is gradually increased, and the UV-range metamerism index (MIuv) is decreased, such that the low UV-range metamerism index (MIuv) of 1.0 or lower may be maintained when the input electric current (IF) is within a range from 270 mA to 310 mA.

Further, in the exemplary embodiment of the present invention, the illuminant module 10 may be configured by using all of the one or more second white light-emitting diode devices 101 having the average color rendering index of 90% or higher and the one or more blue light-emitting diode devices 102 having the peak emission wavelength of 400 nm to 470 nm in addition to the first white light-emitting diode 100 and the ultraviolet light-emitting diode 220.

Therefore, referring to FIG. 14, which making a comparison between experimental performance results of Example 1 (the first white light-emitting diode 100 and the ultraviolet light-emitting diode 220) and Example 4 (the first white light-emitting diode 100, the ultraviolet light-emitting diode 220, the second white light-emitting diode 101, and the blue light-emitting diode 102), it can be ascertained that the performance value is greatly improved even in Example 4 in which the visible-range metamerism index (MIvis) is 0.6 and the UV-range metamerism index (MIuv) is 0.9 (in Example 1, the visible-range metamerism index (MIvis) is 0.7 and the UV-range metamerism index (MIuv) is 1.5).

In addition, as can be seen in FIG. 15C, it can be seen that even in Example 4, as the input electric current (IF) is increased, the numerical value of the UV content is gradually increased, and the UV-range metamerism index (MIuv) is decreased, such that the low UV-range metamerism index (MIuv) of 1.0 or lower may be maintained when the input electric current (IF) is within a range from 250 mA to 280 mA.

In addition, in the exemplary embodiment of the present invention, the illuminant module 10 includes the one or more ultraviolet light-emitting diode devices 220 having the peak emission wavelength of 300 nm to 400 nm and the one or more second white light-emitting diode devices 101 having the average color rendering index of 90% or higher. The second white light-emitting diode device 101 is a light-emitting diode (LED) device including the second LED chip 140 having the excitation wavelength of 400 nm to 440 nm and the second phosphor layer 160 configured to emit light by being excited at the excitation wavelength of the second LED chip 140. The second phosphor layer 160 may include the first phosphor 152 having the peak emission wavelength of 440 nm to 499 nm, the second phosphor 153 having the peak emission wavelength of 500 nm to 580 nm, and the third phosphor 154 having the peak emission wavelength of 600 nm to 699 nm.

Further, two or more types of light-emitting diode (LED) devices having different peak wavelengths may be used as the second white light-emitting diode devices 101, thereby improving characteristics, such as the metamerism index, of the illuminant module 10.

In addition, the numerical value of the UV content of the illuminant module 10 may be within the range from 60 to 160, and two or more types of light-emitting diode (LED) devices having different peak wavelengths may be used as the ultraviolet light-emitting diode devices 220.

In addition, the illuminant module 10 may further include the one or more blue light-emitting diode devices 102 having the peak emission wavelength of 400 nm to 470 nm. In this case, the peak wavelength spectrum intensity of the ultraviolet light-emitting diode device 220 at the wavelength of 300 nm to 400 nm may be within the range of 60% to 90% of the peak wavelength spectrum intensity of the blue light-emitting diode device 102 at the wavelength of 400 nm to 470 nm, thereby further improving characteristics, such as the metamerism index, of the illuminant module 10.

Therefore, referring to FIG. 14, when making a comparison between experimental performance results of Example 1 (the first white light-emitting diode 100 having the excitation wavelength of 440 nm to 460 nm and the ultraviolet light-emitting diode 220) and Example 5 (the first white light-emitting diode 100 having the excitation wavelength of 400 nm to 440 nm and the ultraviolet light-emitting diode 220), it can be ascertained that the performance value is greatly improved even in Example 5 in which the visible-range metamerism index (MIvis) is 0.4 and the UV-range metamerism index (MIuv) is 1.0 (in Example 1, the visible-range metamerism index (MIvis) is 0.7 and the UV-range metamerism index (MIuv) is 1.5).

In addition, as can be seen in FIG. 15D, it can be seen that even in Example 5, as the input electric current (IF) is increased, the numerical value of the UV content is gradually increased, and the UV-range metamerism index (MIuv) is decreased, such that the UV-range metamerism index (MIuv) may be decreased to 1.0 when the input electric current (IF) is 160 mA.

In addition, FIG. 16 exemplarily illustrates experimental performance results for respective items according to the specifications of the illuminant D50 of the illuminant module 10 according to the exemplary embodiments (Examples 1 to 5) of the present invention.

As can be seen in FIG. 16, in Example 1 (the first white light-emitting diode 100 and the ultraviolet light-emitting diode 220), the visible-range metamerism index (MIvis) is 0.5, and the UV-range metamerism index (MIuv) is 0.8. In contrast, it can be ascertained that the performance value is further improved in Example 2 (the first white light-emitting diode 100, the ultraviolet light-emitting diode 220, and the blue light-emitting diode 102) in which the visible-range metamerism index (MIvis) is 0.5 and the UV-range metamerism index (MIuv) is 0.6.

In addition, in the exemplary embodiments of the present invention, it can be ascertained that the metamerism index characteristics are further improved even in Example 3 (the first white light-emitting diode 100, the ultraviolet light-emitting diode 220, and the second white light-emitting diode 101) in which the visible-range metamerism index (MIvis) is 0.4 and the UV-range metamerism index (MIuv) is 0.6, Example 4 (the first white light-emitting diode 100, the ultraviolet light-emitting diode 220, the second white light-emitting diode 101, and the blue light-emitting diode 102) in which the visible-range metamerism index (MIvis) is 0.5 and the UV-range metamerism index (MIuv) is 0.6, and Example 5 (the first white light-emitting diode 100 having the excitation wavelength of 400 nm to 440 nm and the ultraviolet light-emitting diode 220) in which the visible-range metamerism index (MIvis) is 0.5 and the UV-range metamerism index (MIuv) is 0.7.

In this regard, FIGS. 17A to 17D exemplarily illustrate performance measured values for respective items according to the specifications of the illuminant D50 in respect to Examples 2 to 5.

First, as can be seen in FIG. 17A, it can be seen that even in Example 2, as the input electric current (IF) is increased, the numerical value of the UV content is gradually increased, and the UV-range metamerism index (MIuv) is decreased, such that the UV-range metamerism index (MIuv) may be decreased to about 0.6 and optimized when the input electric current (IF) is within the range of 370 mA to 390 mA.

In addition, it can be ascertained that the UV-range metamerism index (MIuv) may be optimized to be about 0.6 when the input electric current (IF) is within the range from 260 mA to 280 mA in Example 3 as can be seen in FIG. 17B, the UV-range metamerism index (MIuv) may be optimized to be about 0.6 when the input electric current (IF) is within the range from 320 mA to 330 mA in Example 4 as can be seen in FIG. 17C, and the UV-range metamerism index (MIuv) may be decreased to about 0.7 or lower when the input electric current (IF) is within the range from 120 mA to 130 mA in Example 5 as can be seen in FIG. 17D.

In addition, FIGS. 18A and 18B exemplarily illustrate light emitting spectra according to the specifications of the illuminants D65 and D50 of the illuminant module 10 according to various exemplary embodiments (Examples 1 to 5) of the present invention.

Therefore, in the case of the illuminant module 10 according to the exemplary embodiment of the present invention, the illuminant module 10 is configured by using the ultraviolet light-emitting diode (LED) device having the peak emission wavelength of 300 nm to 400 nm and the one or more first white light-emitting diode devices 100 having the average color rendering index of 90% or higher and including the first LED chip 130 having the excitation wavelength of 440 nm to 460 nm and the first phosphor layer 150 configured to emit light at the excitation wavelength of the first LED chip 130, such that the high color rendering standard LED illuminant module having high color rendering properties and excellent metamerism index characteristics may be provided.

In addition, according to the present invention, the illuminant module 10 further includes the one or more second white light-emitting diode devices 101 having the average color rendering index of 90% or higher and including the second LED chip 140 having the excitation wavelength of 400 nm to 440 nm and the second phosphor layer 160 configured to emit light at the excitation wavelength of the second LED chip 140, the first white light-emitting diode 100 having the first LED chip 130 having the excitation wavelength of 400 nm to 440 nm is used, or the illuminant module 10 further includes the blue light-emitting diode device 102 having the peak emission wavelength of 400 nm to 470 nm, such that the illuminant module 10 having improved metamerism index characteristics may be implemented.

Figure 1:
FIG. 1 is a view exemplarily illustrating a color inspection apparatus using typical standard lighting.

Further, as illustrated in FIG. 1, the lighting apparatus according to another exemplary embodiment of the present invention may include the illuminant module 10 and may be implemented as an apparatus for inspecting colors or the like of subjects to be inspected.

The above-mentioned exemplary embodiments of the present invention are not implemented only by an apparatus and a method. Based on the above-mentioned descriptions of the exemplary embodiments, those skilled in the art to which the present invention pertains may easily realize the exemplary embodiments through programs for realizing functions corresponding to the configuration of the exemplary embodiment of the present invention or recording media on which the programs are recorded.

Although the exemplary embodiments of the present invention have been described in detail hereinabove, the right scope of the present invention is not limited thereto, and it should be clearly understood that many variations and modifications of those skilled in the art using the basic concept of the present invention, which is defined in the following claims, will also belong to the right scope of the present invention.

What is claimed is:

1. An illuminant module comprising:
one or more ultraviolet light-emitting diode (LED) devices having a peak emission wavelength of 300 nm to 400 nm; and
one or more first white light-emitting diode (LED) devices having an average color rendering index of 90% or higher,
wherein the first white light-emitting diode (LED) device is a light-emitting diode (LED) device comprising a first LED chip having an excitation wavelength of 440 nm to 460 nm, and a first phosphor layer configured to emit light by being excited at the excitation wavelength of the first LED chip, and the first phosphor layer comprises a first phosphor having a peak emission wavelength of 460 nm to 499 nm, a second phosphor having a peak emission wavelength of 500 nm to 580 nm, and a third phosphor having a peak emission wavelength of 600 nm to 699 nm,
wherein the illuminant module has a light emitting characteristic in which a visible-range metamerism index (Mlvis) is 1.0 or lower and a UV-range metamerism index (Mluv) is 1.5 or lower by the ultraviolet light-emitting diode (LED) device and the first white light-emitting diode (LED) device.

2. The illuminant module of claim 1, wherein a numerical value of UV content of the illuminant module is within a range from 60 to 160.

3. The illuminant module of claim 1, wherein two or more types of light-emitting diode (LED) devices having different peak wavelengths are used as the first white light-emitting diode (LED) devices.

4. The illuminant module of claim 1, wherein two or more types of light-emitting diode (LED) devices having different peak wavelengths are used as the ultraviolet light-emitting diode (LED) devices.

5. The illuminant module of claim 1, wherein the illuminant module has a light emitting characteristic in which an average color rendering index (Ra) is 90% or higher and a special color rendering indexes (R9 to R15) is 80% or higher.

6. The illuminant module of claim 1, wherein a correlated color temperature CCT is within a range from 2,000K to 10,000K.

7. The illuminant module of claim 1, further comprising:
one or more blue light-emitting diode (LED) devices having a peak emission wavelength of 400 nm to 470 nm.

8. The illuminant module of claim 7, wherein peak wavelength spectrum intensity of the ultraviolet light-emitting diode (LED) device at a wavelength of 300 nm to 400 nm is within a range of 60% to 90% of peak wavelength spectrum intensity of the blue light-emitting diode (LED) device at a wavelength of 400 nm to 470 nm.

9. An illuminant module comprising:
one or more ultraviolet light-emitting diode (LED) devices having a peak emission wavelength of 300 nm to 400 nm;
one or more first white light-emitting diode (LED) devices having an average color rendering index of 90% or higher;
one or more second white light-emitting diode (LED) devices having an average color rendering index of 90% or higher; and
one or more blue light-emitting diode (LED) devices having a peak emission wavelength of 400 nm to 470 nm,
wherein the first white light-emitting diode (LED) device is a light-emitting diode (LED) device comprising a first LED chip having an excitation wavelength of 440 nm to 460 nm, and a first phosphor layer configured to emit light by being excited at the excitation wavelength of the first LED chip, and the first phosphor layer comprises a first phosphor having a peak emission wavelength of 460 nm to 499 nm, a second phosphor having a peak emission wavelength of 500 nm to 580 nm, and a third phosphor having a peak emission wavelength of 600 nm to 699 nm,
wherein the second white light-emitting diode (LED) device is a light-emitting diode (LED) device comprising a second LED chip having an excitation wavelength of 400 nm to 440 nm and a second phosphor layer configured to emit light by being excited at the excitation wavelength of the second LED chip, and the second phosphor layer comprises a first phosphor having a peak emission wavelength of 440 nm to 499 nm, a second phosphor having a peak emission wavelength of 500 nm to 580 nm, and a third phosphor having a peak emission wavelength of 600 nm to 699 nm.

10. The illuminant module of claim 9, wherein two or more types of light-emitting diode (LED) devices having different peak wavelengths are used as the first white light-emitting diode (LED) device and the second white light-emitting diode (LED) device.

11. An illuminant module comprising:
one or more ultraviolet light-emitting diode (LED) devices having a peak emission wavelength of 300 nm to 400 nm; and
one or more second white light-emitting diode (LED) devices having an average color rendering index of 90% or higher,
wherein the second white light-emitting diode (LED) device is a light-emitting diode (LED) device comprising a second LED chip having an excitation wavelength of 400 nm to 440 nm, and a second phosphor layer configured to emit light by being excited at the excitation wavelength of the second LED chip, and the second phosphor layer comprises a first phosphor having a peak emission wavelength of 440 nm to 499 nm, a second phosphor having a peak emission wavelength of 500 nm to 580 nm, and a third phosphor having a peak emission wavelength of 600 nm to 699 nm.

12. The illuminant module of claim 11, wherein a numerical value of UV content of the illuminant module is within a range from 60 to 160.

13. The illuminant module of claim 11, wherein two or more types of light-emitting diode (LED) devices having different peak wavelengths are used as the second white light-emitting diode (LED) devices.

14. The illuminant module of claim 11, wherein two or more types of light-emitting diode (LED) devices having different peak wavelengths are used as the ultraviolet light-emitting diode (LED) devices.

15. The illuminant module of claim 11, further comprising:
one or more blue light-emitting diode (LED) devices having a peak emission wavelength of 400 nm to 470 nm.

16. The illuminant module of claim 15, wherein peak wavelength spectrum intensity of the ultraviolet light-emitting diode (LED) device at a wavelength of 300 nm to 400 nm is within a range of 60% to 90% of peak wavelength spectrum intensity of the blue light-emitting diode (LED) device at a wavelength of 400 nm to 470 nm.

17. A lighting apparatus comprising the illuminant module according to claim 1 or 11.

18. The lighting apparatus of claim 17, further comprising:
a light transmissive member configured to be made of PMMA, glass, or a material that transmits an ultraviolet ray.

* * * * *